US012694937B2

(12) United States Patent
Bak et al.

(10) Patent No.: US 12,694,937 B2
(45) Date of Patent: Jul. 28, 2026

(54) MEMORY DEVICE

(71) Applicant: Samsung Electronics Co., Ltd.,
Suwon-si (KR)

(72) Inventors: Jungmin Bak, Suwon-si (KR); Sangkil Lee, Suwon-si (KR)

(73) Assignee: Samsung Electronics Co., Ltd.,
Suwon-si (KR)

(*) Notice: Subject to any disclaimer, the term of this patent is extended or adjusted under 35 U.S.C. 154(b) by 249 days.

(21) Appl. No.: 18/451,969

(22) Filed: Aug. 18, 2023

(65) Prior Publication Data

US 2024/0249788 A1      Jul. 25, 2024

(30) Foreign Application Priority Data

Jan. 25, 2023    (KR) ........................ 10-2023-0009630

(51) Int. Cl.
*G11C 29/10*      (2006.01)
*G11C 7/10*       (2006.01)

(52) U.S. Cl.
CPC ............ *G11C 29/10* (2013.01); *G11C 7/1048* (2013.01)

(58) Field of Classification Search
None
See application file for complete search history.

(56) References Cited

U.S. PATENT DOCUMENTS 7,285,979 B2    10/2007  Janzen et al.
7,436,204 B2    10/2008  Choi et al.

7,554,354 B2    6/2009   Kim
7,888,964 B2    2/2011   Park
8,274,308 B2*   9/2012   McCall ................ G11C 7/1084
                                                  365/198
10,998,113 B2*  5/2021   Potasek .................. H01C 17/22
2007/0016835 A1* 1/2007  Hronik ............ G01R 31/31718
                                                  714/727
2018/0167055 A1* 6/2018  Gans ...................... G11C 29/16

FOREIGN PATENT DOCUMENTS

JP         5344577 B2      8/2013
KR     20110013704 A       2/2011

* cited by examiner

*Primary Examiner* — Mark D Featherstone
*Assistant Examiner* — Matthew W Wahlin
(74) *Attorney, Agent, or Firm* — Wolf, Greenfield & Sacks, P.C.

(57)        ABSTRACT

A memory device includes a mode register configured to store a first code for indicating termination resistance of the memory device and a second code for disabling a defective resistor, and an output driver including a plurality of pull-up units including a plurality of pull-up resistors and a plurality of pull-down units including a plurality of pull-down resistors. The output driver is configured to disable or enable respective pull-up resistors and pull-down resistors based on the second code, enable a subset of pull-up units from among the plurality of pull-up units including the respective pull-up resistors based on the first code, and enable a subset of pull-down unit from among the plurality of pull-down units including the respective pull-down resistors based on the first code.

20 Claims, 18 Drawing Sheets

| FUNCTION | REGISTER TYPE | OPERAND | DATA | NOTES |
|---|---|---|---|---|
| DEFECT RESISTOR | WRITE-ONLY | OP[7:0] | 0b = ENABLE, 1b = DISABLE | |

| OP[7] | OP[6] | OP[5] | OP[4] | OP[3] | OP[2] | OP[1] | OP[0] |
|-------|-------|-------|-------|-------|-------|-------|-------|
| RFU   | RFU   | R5    | R4    | R3    | R2    | R1    | R0    |

MEMORY DEVICE

CROSS-REFERENCE TO RELATED APPLICATION

This application is based on and claims priority under 35 U.S.C. § 119 to Korean Patent Application No. 10-2023-0009630 filed on Jan. 25, 2023, in the Korean Intellectual Property Office, the disclosure of which is incorporated by reference herein in its entirety.

FIELD

The present disclosure relates to a memory device.

BACKGROUND

A memory device may include mode registers for providing various operations and control parameters used for setting operating conditions on the memory device. As an operation speed of the memory device increases, swing widths of signals transmitted/received between the memory device and a memory controller may be reduced, and distortion of the signals caused by an impedance mismatch may be worsened. The memory controller can reduce signal distortion caused by the operation speed by setting different input and output (I/O) parameters such as pull-down drive strength to the mode registers of the memory device according to the operation speed.

SUMMARY

Provided is a semiconductor device for detecting defects of a resistor of an output driver.

Also provided is a semiconductor device for repairing defects of a resistor of an output driver.

An example embodiment of the present disclosure provides a memory device including a mode register configured to store a first code for indicating termination resistance of the memory device and a second code for disabling a defective resistor; and an output driver comprising a plurality of pull-up units including a plurality of pull-up resistors and a plurality of pull-down units including a plurality of pull-down resistors, where respective pull-up resistors and respective pull-down resistors are configured to be disabled or enabled based on the second code The output driver is configured to enable a subset of pull-up units from among the plurality of pull-up units including the respective pull-up resistors based on the first code, and is configured to enable a subset of pull-down units from among the plurality of pull-down units including the respective pull-down resistors based on the first code.

In some embodiments, a collective pull-up resistance of the respective pull-up resistors of the subset of pull-up units and/or a collective pull-down resistance of the respective pull-down resistors of the subset of pull-down units is substantially equivalent to the termination resistance.

In some embodiments, the output driver further comprises at least one repair pull-up unit including at least one repair pull-up resistor and at least one repair pull-down unit including at least one repair pull-down resistor, and is configured to enable the subset of pull-up units from among the plurality of pull-up units including the respective pull-up resistors and the at least one repair pull-up unit based on the first code, and is configured to enable the subset of pull-down units from among the plurality of pull-down units including the respective pull-down resistors and the at least one repair pull-down unit based on the first code.

In some embodiments, a number of the at least one repair pull-up units is equal to or less than a number of pull-up units included the subset of pull-up units, and a number of the at least one repair pull-down units is equal to or less than a number of pull-down units included in the subset of pull-down units.

In some embodiments, the at least one repair pull-up resistor and the at least one repair pull-down resistor comprise variable resistors, and respective resistances of the variable resistors are configured to be adjusted based on the first code.

In some embodiments, the second code includes a plurality of bits corresponding to the respective pull-up resistors, and a value of a bit that corresponds to the defective resistor from among the plurality of bits is different from values of other bits among the plurality of bits, and the output driver is configured to disable one of the respective pull-up resistors that corresponds to the defective resistor and one of the respective pull-down resistors that is paired with the one of the respective pull-up resistors.

In some embodiments, the second code includes a third code including a plurality of bits that correspond to the respective pull-up resistors and a fourth code including a plurality of bits that correspond to the respective pull-down resistors, and a value of a bit that corresponds to the defective resistor from among the plurality of bits is different from values of other bits among the plurality of bits, and the output driver is configured to disable one of the respective pull-up resistors that corresponds to the defective resistor based on the third code, and is configured to disable one of the respective pull-down resistors that corresponds to the defective resistor based on the fourth code.

In some embodiments, the plurality of pull-up units are coupled in parallel to each other, and the plurality of pull-down units are coupled in parallel to each other, and the output driver is configured to increase a number of pull-up units included in the subset of pull-up units and a number of pull-down units included in the subset of pull-down units as resistance of the termination resistance indicated by the first code is reduced.

An example embodiment of the present disclosure provides a memory system, including a memory device comprising a data input and output circuit including a plurality of pull-up units and a plurality of pull-down units and configured to output data signals through a data input and output pad, and a mode register configured to store a code for disabling at least one of a plurality of resistors included in the data input and output circuit; and a memory controller configured to receive a data signal among the data signals, determine whether the data signal indicates a defect, generate the code responsive to determining that the data signal indicates the defect, and provide the code to the memory device.

In some embodiments, the memory controller is configured to determine whether the data signal indicates the defect based on whether a voltage level of the data signal is recognizable as a logic value "0" or "1".

In some embodiments, when the data signal has a defect, the memory controller is configured to change a value of the code and provide the code indicating the value that was changed to the memory device.

In some embodiments, the plurality of pull-up units include pull-up resistors, the plurality of pull-down units include pull-down resistors, and the plurality of resistors include the pull-up resistors and the pull-down resistors.

In some embodiments, when the data signal is not recognizable as a logic value "O", the memory controller is configured to determine that defects are generated due to one or more of the pull-down resistors, and is configured to generate the code for disabling the one or more of the pull-down resistors. When the data signal is not recognizable as a logic value "1", the memory controller is configured to determine that defects are generated due to one or more of the pull-up resistors, and is configured to generate the code for disabling the one or more of the pull-up resistors.

In some embodiments, the code includes a plurality of bits that correspond to the pull-up resistors, a value of a bit among the plurality of bits that corresponds to a defective resistor is different from values of other bits among the plurality of bits, and the memory device is configured to disable one of the pull-up resistors that corresponds to the defective resistor and one of the pull-down resistors that is paired with the one of the pull-up resistors.

In some embodiments, the memory controller is configured to generate a parameter for setting termination resistance of the memory device, and the memory device is configured to enable a subset of pull-up units that corresponds to a value of the parameter from among the plurality of pull-up units and a subset of pull-down units that corresponds to a value of the parameter from among the plurality of pull-down units, and is configured to output the data signal.

In some embodiments, the plurality of pull-up units are coupled in parallel to each other, the plurality of pull-down units are coupled in parallel to each other, and the memory device is configured to increase a number of pull-up units included in the subset of pull-up units and a number of pull-down units included in the subset of pull-down units as resistance value of the termination resistance indicated by the parameter is reduced.

An example embodiment of the present disclosure provides a method for operating a memory device. The method includes setting termination resistance of a memory device; writing or reading test data to or from a first in, first out (FIFO) portion of the memory device; determining whether a data signal output by the memory device indicates a defect; and disabling one or more resistors corresponding to the defect and enabling one or more repair resistors, among a plurality of resistors included in the memory device.

In some embodiments, the determining whether the data signal indicates the defect comprises determining whether the data signal indicates the defect based on whether a voltage level of the data signal is recognized as a logic value "0" or "1".

In some embodiments, the disabling the one or more resistors corresponding to the defect and the enabling the one or more repair resistors comprises enabling a number of the one or more repair resistors based on a number of the one or more resistors that were disabled.

In some embodiments, the disabling the one or more resistors corresponding to the defect and the enabling the one or more repair resistors comprises adjusting resistance of the one or more repair resistors based on resistance of the one or more resistors that were disabled.

BRIEF DESCRIPTION OF THE DRAWINGS

FIG. 1 shows a block diagram of a memory system according to an embodiment.

FIG. 11 shows an OP code of a memory controller according to an embodiment.
FIG. 12 shows a mode register of a memory device according to an embodiment.
FIG. 13 shows an output driver with repaired resistor defects according to an embodiment.
FIG. 14 shows a block diagram of an output driver of a memory device according to an embodiment.
FIG. 15 shows an output driver in which one resistor defect is repaired according to an embodiment.
FIG. 17 shows an output driver with repaired resistor defects according to an embodiment.

DETAILED DESCRIPTION OF EMBODIMENTS

Figure 2:
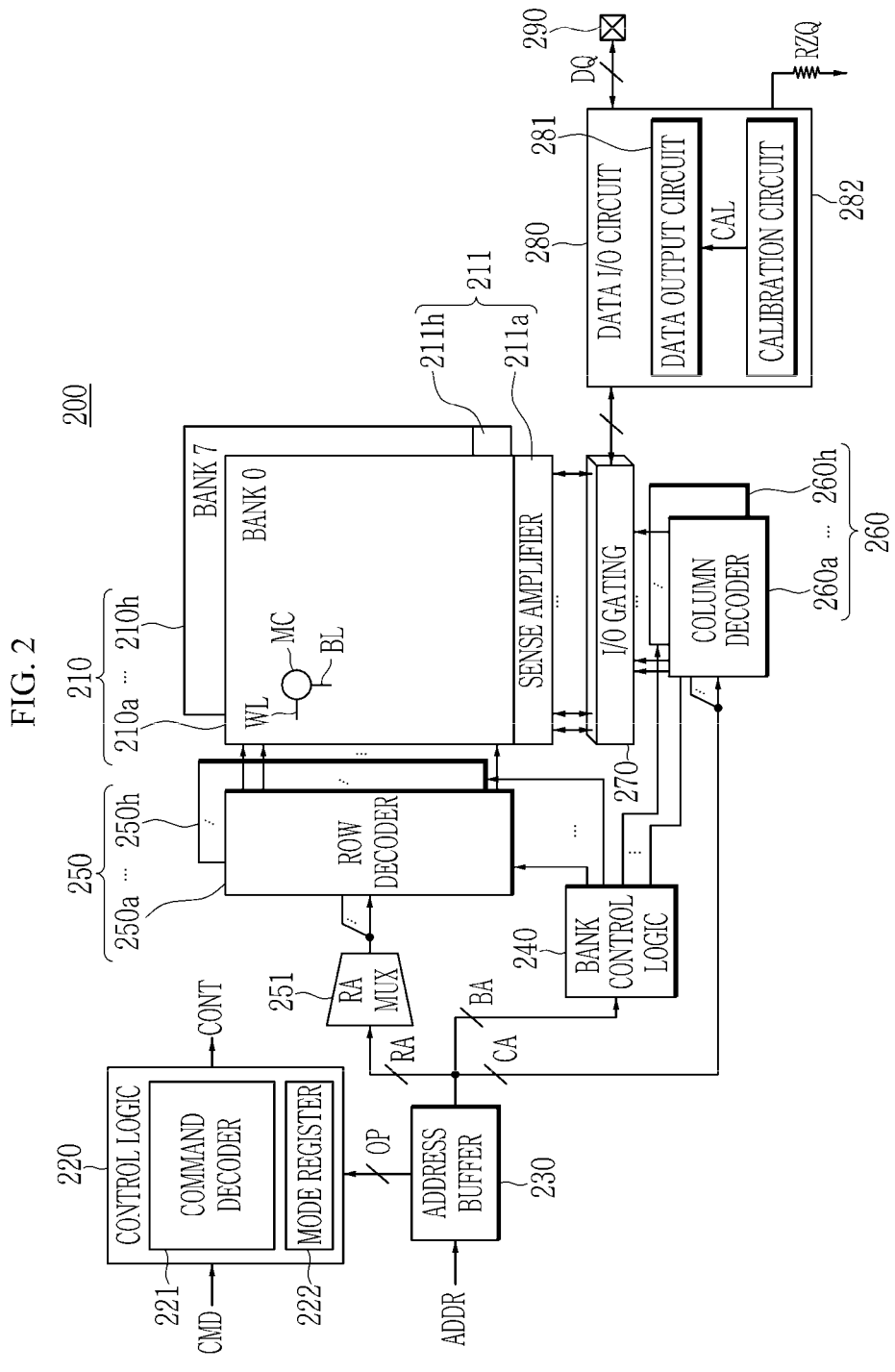
FIG. 2 shows a block diagram of a memory device according to an embodiment.

In the following detailed description, only certain embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive, and like reference numerals designate like elements throughout the specification. In the flowcharts described with reference to the drawings in this specification, the operation order may be changed, various operations may be merged, certain operations may be divided, and certain operations may not be performed.

An expression recited in the singular may be construed as singular or plural unless the expression "one", "single", etc., is used. Terms including ordinal numbers such as first, second, and the like, will be used only to describe various components, and are not to be interpreted as limiting these components. The terms may only be used to differentiate one component from others. The terms "comprises," "comprising," "includes" and/or "including," when used herein, specify the presence of stated elements, but do not preclude the presence of additional elements. The term "and/or" includes any and all combinations of one or more of the associated listed items.

Figure 1:
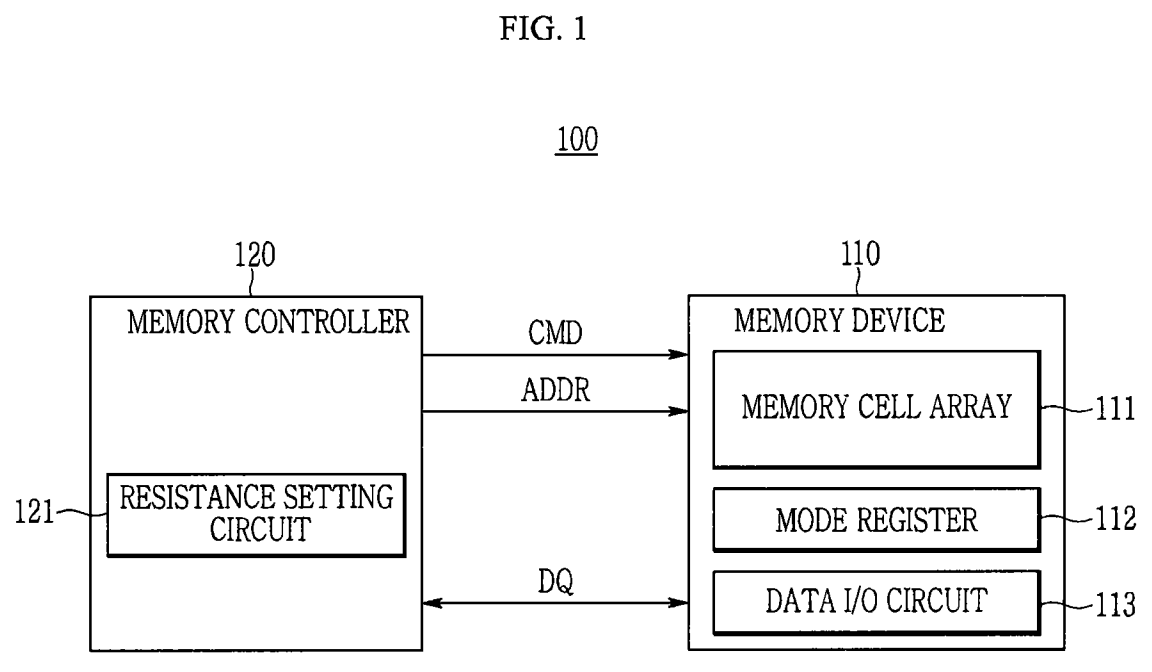

FIG. 1 shows a block diagram of a memory system according to an embodiment.

Referring to FIG. 1, the memory system 100 may include a memory controller 120 and a memory device 110.

The memory controller 120 may be electrically connected to the memory device 110. In an embodiment, the memory controller 120 may transmit/receive signals to/from the memory device 110. The memory controller 120 may provide signals to the memory device 110 to control a memory operation of the memory device 110. The signals may include a command signal CMD and an address ADDR. The memory controller 120 may provide the command signal CMD and the address ADDR to the memory device 110 to control the memory operation such as access to the memory cell array 111, and read or write. A data signal DQ may be transmitted to the memory controller 120 from the memory cell array 111 according to a read operation, and a data signal DQ may be transmitted to the memory cell array 111 from the memory controller 120 according to a write operation.

The command signal CMD may include an activate command, a read/write command, a refresh command, and a mode register set (MRS) command. The activate command may switch a target row of the memory cell array 111 into an active state so as to write data to the memory cell array 111 or read data from the memory cell array 111. The memory cell of the target row may be activated (e.g., driven) in response to the activate command. The read/write command may perform a read or write operation on a target memory cell of the row switched to the active state. The refresh command may perform a refresh operation on the memory cell array 111. The MRS command may include a mode register update (MRU) command, a mode register write (MRW) command, and a mode register read (MRR) command. In an embodiment, the mode register write command may write an operation OP code or an operand to the mode register 112.

The memory controller 120 may change a resistance setting of the data input and output (I/O) circuit 113 of the memory device 110 based on a waveform of the data signal DQ received from the memory device 110. The memory controller 120 may include a resistance setting circuit 121.

The resistance setting circuit 121 may determine whether the data signal DQ transmitted by the memory device 110 is defective or indicates a defect. In an embodiment, the resistance setting circuit 121 may receive the data signal DQ that is output corresponding to a logic value "0" from the data I/O circuit 113 of the memory device 110, and may determine whether the data signal DQ (e.g., the voltage indicated thereby) is recognized as the logic value "0". The resistance setting circuit 121 may receive the data signal DQ that is output corresponding to a logic value "1" from the data I/O circuit 113 of the memory device 110, and may determine whether the data signal DQ (e.g., the voltage indicated thereby) is recognized as the logic value "1". In an embodiment, the resistance setting circuit 121 may compare voltage sizes of the data signals DQ that are output corresponding to a same logic value, and may determine the data signal DQ having a relatively small voltage to be defective.

When or responsive to determining that the data signal DQ has or indicates a defect, the resistance setting circuit 121 may change the resistor setting of the data I/O circuit 113 of the memory device 110. The resistance setting circuit 121 may generate an OP code for disabling at least one resistor included in the data I/O circuit 113. The data I/O circuit 113 may include a plurality of pull-up resistors and pull-down resistors, and at least one of the pull-up resistors and at least one of the pull-down resistors may be disabled by the OP code generated by the resistance setting circuit 121. For example, the OP code may be transmitted to the memory device 110 together with the mode register write command MRW, and may be written to the mode register 112. The memory device 110 may refer to the mode register 112, and may disable at least one pull-down resistor and at least one pull-up resistor included in the data I/O circuit 113.

The resistance setting circuit 121 may generate an OP code for enabling at least one repair resistor of the data I/O circuit 113. The data I/O circuit 113 may include at least one pull-up repair resistor and at least one pull-down repair resistor, and at least one of the at least one pull-up repair resistor and at least one of the at least one pull-down repair resistor may be enabled by the OP code generated by the resistance setting circuit 121. In some embodiments, the resistance setting circuit 121 may enable the repair resistor that corresponds to a disabled resistor, e.g., so as to enable one or more repair resistors that (collectively) provide the same resistance value as the disabled or defective resistor(s). For example, the resistance setting circuit 121 may generate an OP code for disabling one 240-ohm resistor and enabling one 240-ohm repair resistor. The resistance setting circuit 121 may generate an OP code for disabling two 240-ohm resistors, and enabling two 240-ohm repair resistors, or enabling one 120-ohm repair resistor. In some embodiments, the repair resistor of the data I/O circuit 113 may be a variable resistor, and the resistance setting circuit 121 may generate an OP code for enabling the repair resistor and setting resistance of the repair resistor. For example, the resistance setting circuit 121 may generate an OP code for disabling two 240-ohm resistors, enabling the repair resistor, and setting resistance of the repair resistor to be 120 ohm.

In addition, the memory controller 120 may include various types of intellectual property (IP) or application-specific circuits. The memory controller 120 may be referred to as an application processor (AP).

In some embodiments, the memory controller 120 may access the memory device 110 according to a request from an external host of the memory system 100. The memory controller 120 may communicate with the host by using various protocols.

The memory device 110 may be a storage device based on the semiconductor device. The memory device 110 may include a dynamic random access memory (DRAM) device. In some embodiments, the memory device 110 may be a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, a solid state drive (SSD), a memory card, and a universal flash storage (UFS) device. The memory device 110 may be described to be a DRAM device (i.e., a synchronous dynamic random access memory (SDRAM) device synchronized with data clock signals WCK output by the memory controller 120. Particularly, the memory device 110 may be a low power double data rate 6 (LPDDR6) SDRAM. The memory device 110 may be or may include a component device that is not the storage device.

The memory device 110 includes a memory cell array 111, a mode register 112, and a data I/O circuit 113. The memory cell array 111 includes memory cells connected to rows and columns. In some embodiments, the rows may be defined by word lines, and the columns may be defined by bit lines. The data I/O circuit 113 may store data transmitted to the memory cell array 111 from the outside (e.g., from an external device) or may output the data stored in the memory cell array 111 to an outside (i.e., the memory controller 120, etc.,) of the memory device 110.

The mode register 112 may store information needed for an operation of the memory device 110. The mode register 112 may store setting values for various operation modes supported by the memory device 110 based on the MRS. The information stored in the mode register 112 may be changed based on the MRS and the OP code. Here, the setting values stored in the mode register 112 relate to the entire memory device 110, and the number of the mode registers 112 may be at least one. The memory controller 120 may set various operation modes of the memory device 110 by using the setting values stored in the mode register 112.

The mode register 112 may store information for enabling some of a plurality of resistors included in the data I/O circuit 113. For example, the memory device 110 may enable some of a plurality of pull-down resistors of the data I/O circuit 113 by referring to pull-down drive strength (PDDS) information stored in the mode register 112, and the data I/O circuit 113 may output the data signal DQ by using the enabled pull-down resistors.

The mode register 112 may store information for disabling some of a plurality of resistors included in the data I/O circuit 113. For example, the memory device 110 may refer to information on the defective resistors stored in the mode register 112, and may disable some of a plurality of pull-down resistors of the data I/O circuit 113. The memory device 110 may enable the pull-down resistors except the disabled defective pull-down resistors when an operation speed of the memory device 110 is changed. That is, the data I/O circuit 113 may enable the pull-down resistors by the number that corresponds to PDDS information from among the pull-down resistors except the disabled pull-down resistors, and may output the data signal DQ by using the enabled pull-down resistors.

The mode register 112 may store information for enabling some of the repair resistors included in the data I/O circuit 113. For example, the memory device 110 may enable one or more repair resistors of the data I/O circuit 113 by referring to information on the repair resistor stored in the mode register 112, and the data I/O circuit 113 may output a data signal DQ by using the enabled repair resistors.

The mode register 112 may store information for setting resistance of the repair resistor included in the data I/O circuit 113. For example, the memory device 110 may adjust resistance of the enabled repair resistor(s) of the data I/O circuit 113 by referring to information on repair resistance stored in the mode register 112, and the data I/O circuit 113 may output the data signal DQ by using the enabled repair resistor.

The data I/O circuit 113 may output the data signal DQ. The data I/O circuit 113 may include a plurality of pull-up units and a plurality of pull-down units, and may output the data signal DQ based on data read from the memory cell array 111 or a first-in first-out (FIFO) portion (not shown). The respective pull-up units may include a pull-up resistor, and the respective pull-down units may include a pull-down resistor. In some embodiments, the data I/O circuit 113 may include at least one repair pull-up unit and at least one repair pull-down unit, and the repair pull-up unit and the repair pull-down unit may respectively include a repair resistor. In some embodiments, the repair resistor may be a variable resistor.

FIG. 2 shows a block diagram of a semiconductor memory device according to an embodiment.

Referring to FIG. 2, the memory device 200 includes a memory cell array 210, a sensing amplifier 211, a control logic circuit 220, an address buffer 230, a row decoder 250, a column decoder 260, an I/O gating circuit 270, a clock signal control circuit, and a data I/O circuit 280.

The memory cell array 210 includes a plurality of memory cells MC. In some embodiments, the memory cell array 210 may include a plurality of memory banks 210a to 210h. FIG. 2 shows eight memory banks BANK0 to BANK7 or 210a to 210h, and the number of the memory banks is not limited thereto. The respective memory banks 210a to 210h may include a plurality of rows, a plurality of columns, and a plurality of memory cells MC arranged at crossings of the rows and the columns. In some embodiments, the rows may be defined by the word lines WL, and the columns may be defined by the bit lines BL.

The control logic circuit 220 controls an operation of the memory device 200. For example, the control logic circuit 220 may generate control signals so that the memory device 200 may perform a read operation, a write operation, and an offset calibration operation. In some embodiments, the control logic circuit 220 may include a command decoder 221. The command decoder 221 may generate a control signal by decoding a command signal CMD provided by the memory controller (e.g., 120 of FIG. 1). The command decoder 221 may decode commands output by the memory controller 120 and may control internal constituent elements of the memory device 200. For example, the command decoder 221 may decode an activate command, a read command, a write command, a precharge command, a mode register set command MRS, a multi-purpose command (MPC), and the like. The above-noted commands may be determined in advance by the JEDEC standard.

In some embodiments, the control logic circuit 220 may further include a mode register 222 for setting an operation mode of the memory device 200. The mode register 222 may store the OP code OP provided by the address buffer 230. The number of the mode registers 222, the address, and the size of the OP code OP may be defined by the JEDEC standard. The memory controller 120 may change the values stored in the mode register 222 and may set the operating condition and the operation mode of the memory device 200 by issuing a mode register write command and an OP code. For example, the setting of various operation modes may include a burst length setting, a read burst type setting, a column address strobe (CAS) latency setting, a delay locked loop (DLL) enable or reset setting, a write recovery (WR) and read to precharge (RTP) setting, an additive latency (AL) setting, a RTT_NOM, RTT_WR, and RTT_PARK setting, an output driver impedance control setting, a write leveling setting, a TDQS enable setting, a write cyclical redundancy checks (CRC) setting, a refresh setting, a CAS write latency (CWL) setting, a multi-purpose register (MPR) setting, a temperature sensor setting, a gear down mode setting, a write and read preamble setting, a reference voltage Vref setting, a power down setting, a data bus inversion (DBI) setting, a data mask setting, an on-die termination (ODT) setting, a parity setting, and a ZQ calibration setting.

The mode register 222 may store an OP code for disabling at least one resistor included in the data output circuit 281, an OP code for enabling at least one repair resistor of the data output circuit 281, and an OP code for enabling the repair resistor of the data output circuit 281 and setting resistance of the repair resistor.

The address buffer 230 receives an address ADDR from the memory controller 120. The address ADDR includes a row address RA for indicating the row of the memory cell array 210 and a column address CA for indicating the column thereof. The row address RA is provided to the row decoder 250, and the column address CA is provided to the column decoder 260. In some embodiments, the row address RA may be provided to the row decoder 250 through a row address multiplexer 251. In some embodiments, the address ADDR may further include a bank address BA for indicating a memory bank. The bank address BA may be provided to the bank control logic 240.

The address buffer 230 may provide the address received with the mode register write command from the memory controller 120 to the mode register 222 as an OP code OP. The OP code OP may be transmitted through command and address transmitting paths between the memory controller 120 and the memory device 200. The OP code OP may be stored in the mode register 222.

In some embodiments, the memory device 200 may further include a bank control logic 240 for generating a bank control signal in response to the bank address BA. The bank control logic 240 may, in response to the bank control signal, activate the row decoder 250 that corresponds to the bank address BA from among a plurality of row decoders 250, and may activate the column decoder 260 that corresponds to the bank address BA from among a plurality of column decoders 260. The memory device 200 may further include a row address multiplexer 251. The row address multiplexer 251 may receive the row address RA from the address buffer 230 and may output the same to the row decoder 250.

The row decoder 250 selects the row to be activated from among a plurality of rows of the memory cell array 210 based on the row address. For this purpose, the row decoder 250 may apply a driving voltage to the word line that corresponds to the row to be activated. In some embodiments, a plurality of row decoders 250a to 250h that correspond to a plurality of memory banks 210a to 210h may be provided to the same.

The column decoder 260 selects the column to be activated from among a plurality of columns of the memory cell array 210 based on the column address. For this purpose, the column decoder 260 may activate the sensing amplifier 211 that corresponds to the column address CA through the I/O gating circuit 270. In some embodiments, a plurality of column decoders 260a to 260h that correspond to a plurality of memory banks 210a to 210h may be provided to the same. In some embodiments, the I/O gating circuit 270 may gate input/output data, and may include a data latch for storing data read from the memory cell array 210 and a write driver for writing data to the memory cell array 210. The data read from the memory cell array 210 may be sensed by the sensing amplifier 211, and may be stored in the I/O gating circuit (270, e.g., the data latch). In some embodiments, a plurality of sensing amplifiers 211a to 211h that correspond to a plurality of memory banks 210a to 210h may be provided to the same.

In some embodiments, the data (e.g., the data stored in the data latch) read from the memory cell array 210 may be provided to the memory controller 120 through the data I/O circuit 280. The data to be written to the memory cell array 210 may be provided to the data I/O circuit 280 from the memory controller 120, and the data provided to the data I/O circuit 280 may be provided to the I/O gating circuit 270.

The data I/O circuit 280 may include a data output circuit 281 and a calibration circuit 282.

The data output circuit 281 may output the data stored in the memory cell array 210 to an outside of the memory device 200. The data output circuit 281 may receive the data read by the input and output sensing amplifier 211. The data output circuit 281 may store the data into a FIFO portion (not shown). The data output circuit 281 may serialize the data and may transmit the serialized data to the memory controller 120 as a data signal DQ. The data output circuit 281 may be connected to a data input and output pad 290.

A transmission line may be connected to the data input and output pad 290. The transmission line may be connected to the memory controller 120. The data output circuit 281 may output the data signal DQ to the memory controller 120 through the data input and output pad 290. The data output circuit 281 may output the data received from the input and output sensing amplifier 211 as the data signal DQ by using a calibration OP code CAL. The data output circuit 281 may generate a pull-up driving signal and a pull-down driving signal based on the calibration OP code CAL and the data. The data output circuit 281 may provide the pull-up driving signal to the pull-up unit and may provide the pull-down driving signal to the pull-down unit to output the data signal DQ.

The calibration circuit 282 generates a calibration code CAL. The calibration circuit 282 may generate the calibration code by using a ZQ resistor RZQ. When termination resistance is accurately corrected according to the calibration code generated by the calibration circuit 282, impedance matching in the memory system may be appropriately performed. Hence, reflection of signals by impedance mismatching may be prevented.

Figure 3:
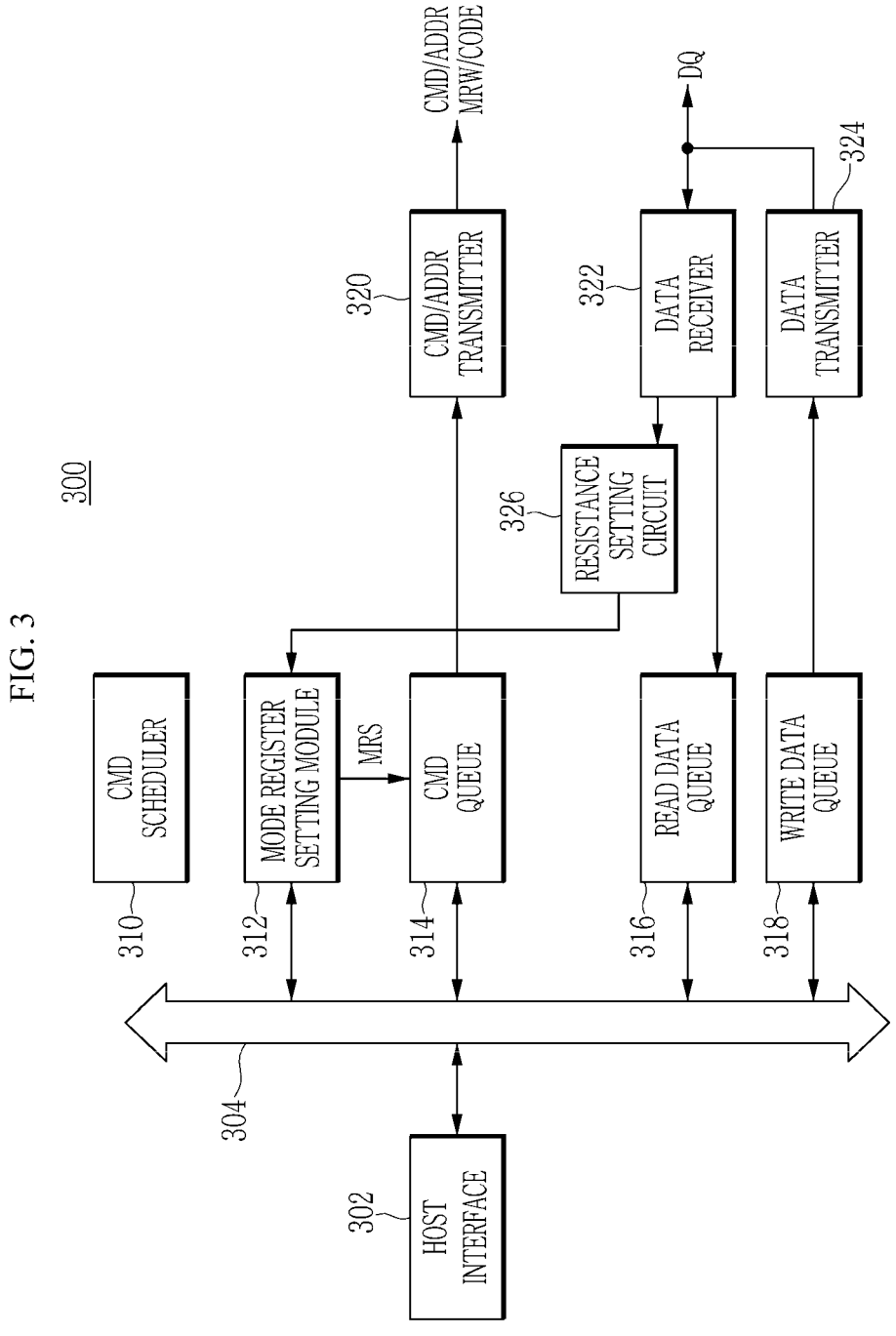
FIG. 3 shows a block diagram of a memory controller according to an embodiment.

FIG. 3 shows a block diagram of a memory controller according to an embodiment.

Referring to FIG. 3, the memory controller 300 may control the memory device 200 of FIG. 2. The memory controller 300 may generate commands CMD and MRW and addresses ADDR/CODE for accessing the memory device 200. The memory controller 300 may generate data to be stored in the memory device 200. The memory controller 300 may receive the data stored in the memory device 200.

The memory controller 300 may include a command scheduler 310, a mode register set module 312, a command queue 314, a read data queue 316, a write data queue 318, a command and address transmitter 320, a data receiver 322, a data transmitter 324, and a resistance setting circuit 326. In the memory controller 300, the command scheduler 310, the mode register set module 312, the command queue 314, the read data queue 316, the write data queue 318, the command and address transmitter 320, the data receiver 322, the data transmitter 324, and the resistance setting circuit 326 may be realized by using hardware, software, or a combination thereof.

The command queue 314 may store commands and addresses issued by an external processor. The commands and the addresses stored in the command queue 314 may be provided to the command and address transmitter 320 based on a control by the command scheduler 310. In this instance, at least one command and at least one address stored in the command queue 314 may be provided in parallel. The command scheduler 310 may adjust orders of the commands and the addresses of the command queue 314, times when the command(s) and the address(es) are input to the command queue 314, and times when the command(s) and the address(es) are output from the command queue 314.

The mode register set module 312 may generate the mode register set command MRS defined by a user based on the communication with the host. The mode register set module 312 may output the mode register set command MRS to the command queue 314. The mode register set command MRS may change the mode register setting of the memory device 200.

The read data queue 316 may store the data transmitted from the memory device 200 by a read request on the memory device 200 of the memory controller 300. The data stored in the read data queue 316 may be processed by the external processor. The write data queue 318 may store the data to be stored in the memory device 200. The data stored in the write data queue 318 may be transmitted to the memory device 200 by a write request on the memory device 200 by the memory controller 300.

The command and address transmitter 320 may receive a command or an address from the command queue 314 and may transmit the command or the address to the memory device 200. For example, the number of paths for transmitting commands and addresses between the command and address transmitter 320 and the memory device 200, logic states of signals transmitted through the paths, and transmission methods may be defined by the JEDEC standards of the memory device 200.

The data receiver 322 may receive data signals DQ from the memory device 200. The data receiver 322 may provide data generated by sampling the data signals DQ to the read data queue 316. The data receiver 322 may arrange the data signals DQ. The data receiver 322 may include a delay locked loop (DLL) including delay cells. For example, the data receiver 322 may delay the data signals DQ based on a time unit delayed by one delay cell, and may find an optimal sampling point for the memory controller 300 to determine the data signals DQ.

The data transmitter 324 may receive data from the write data queue 318. The data transmitter 324 may transmit the received data to the memory device 200 as the data signals DQ. The data transmitter 324 may arrange the data signals DQ. The data transmitter 324 may include the DLL including delay cells. The data transmitter 324 may delay the data signals DQ based on the time unit delayed by one delay cell, and may find the optimal sampling point for the memory device 200 to determine the data signals DQ.

The resistance setting circuit 326 may change the resistor setting of the memory device 200 based on a waveform of the data signal DQ from the memory device 200. The resistance setting circuit 326 may compare the data signals DQ and a reference voltage, and may determine whether the data signals DQ have or indicate defects. The resistance setting circuit 326 may, when the data signals DQ have or indicate defects, generate an OP code CODE for disabling at least one resistor included in the data output circuit 281 of the memory device 200. In some embodiments, the resistance setting circuit 326 may, when the data signals DQ have or indicate defects, control the mode register set module 312 so that the mode register set module 312 may generate a mode register write command MRW and an OP code CODE. The resistance setting circuit 326 may repair defects of resistors of the data output circuit 281 by changing a value of the OP code stored in the mode register 222 of the memory device 200 according to the mode register write command.

Figure 4:
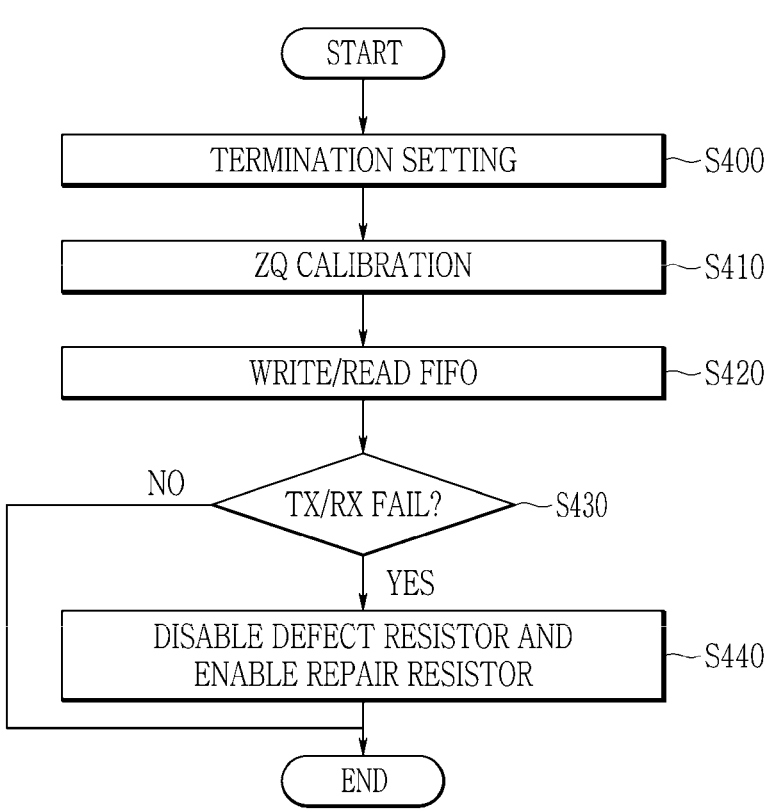
FIG. 4 shows a flowchart of an operation of a memory system according to an embodiment.

FIG. 4 shows a flowchart of an operation of a memory system according to an embodiment.

Referring to FIG. 2, FIG. 3, and FIG. 4, the memory controller 300 sets a termination resistance (S400). To set the termination resistance of the memory device 200, the memory controller 300 may provide an OP code CODE for indicating the mode register set command MRS and the parameter to the memory device 200. In some embodiments, the memory controller 300 may set the termination resistance with the resistance that corresponds to the operation speed of the memory device 200. The memory controller 300 may generate parameters for setting the termination resistance such as PDDS or SoC ODT according to the operation speed of the memory device 200. For example, when the memory system 100 of FIG. 1 is powered up, the memory controller 300 and the memory device 200 may set the termination resistance in a like way of or based on the ZQ resistor RZQ. The memory controller 300 may set the termination resistance to be less than resistance of the ZQ resistor (e.g., RZQ/2, RZQ/3, . . . RZQ/6) as the operation speed of the memory device 200 is changed. For example, PDDS information is expressed in Table 1.

TABLE 1

| Function | Register type | Operand | Data | Notes |
|---|---|---|---|---|
| PDDS (pull-down drive strength) | WRITE-ONLY | OP[2:0] | 000b: RFU 001b: RQZ/1 010b: RZQ/2 011b: RZQ/3 100b: RZQ/4 101b: RQZ/5 010b: RZQ/6 111b: Reserved | |

The memory device 200 performs a ZQ calibration (S410). The memory controller 300 may transmit a ZQ calibration command to the memory device 200. The memory controller 300 may compare the pull-up resistor of the pull-up unit and the ZQ resistor RZQ and may generate a calibration code CAL.

Stages S400 and S410 will now be described with reference to FIG. 5, FIG. 6, and FIG. 7.

Figure 5:
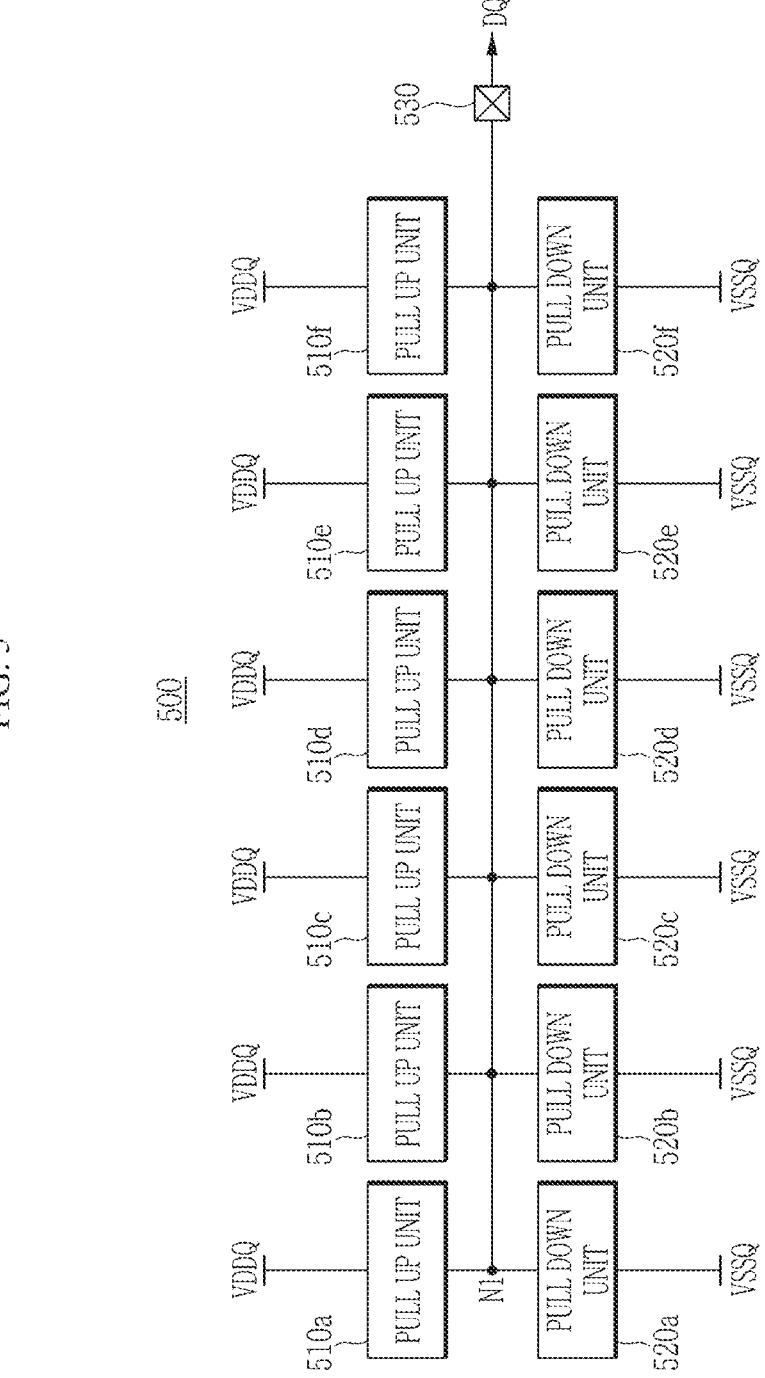
FIG. 5 shows a block diagram of an output driver of a memory device according to an embodiment.
Figure 6:
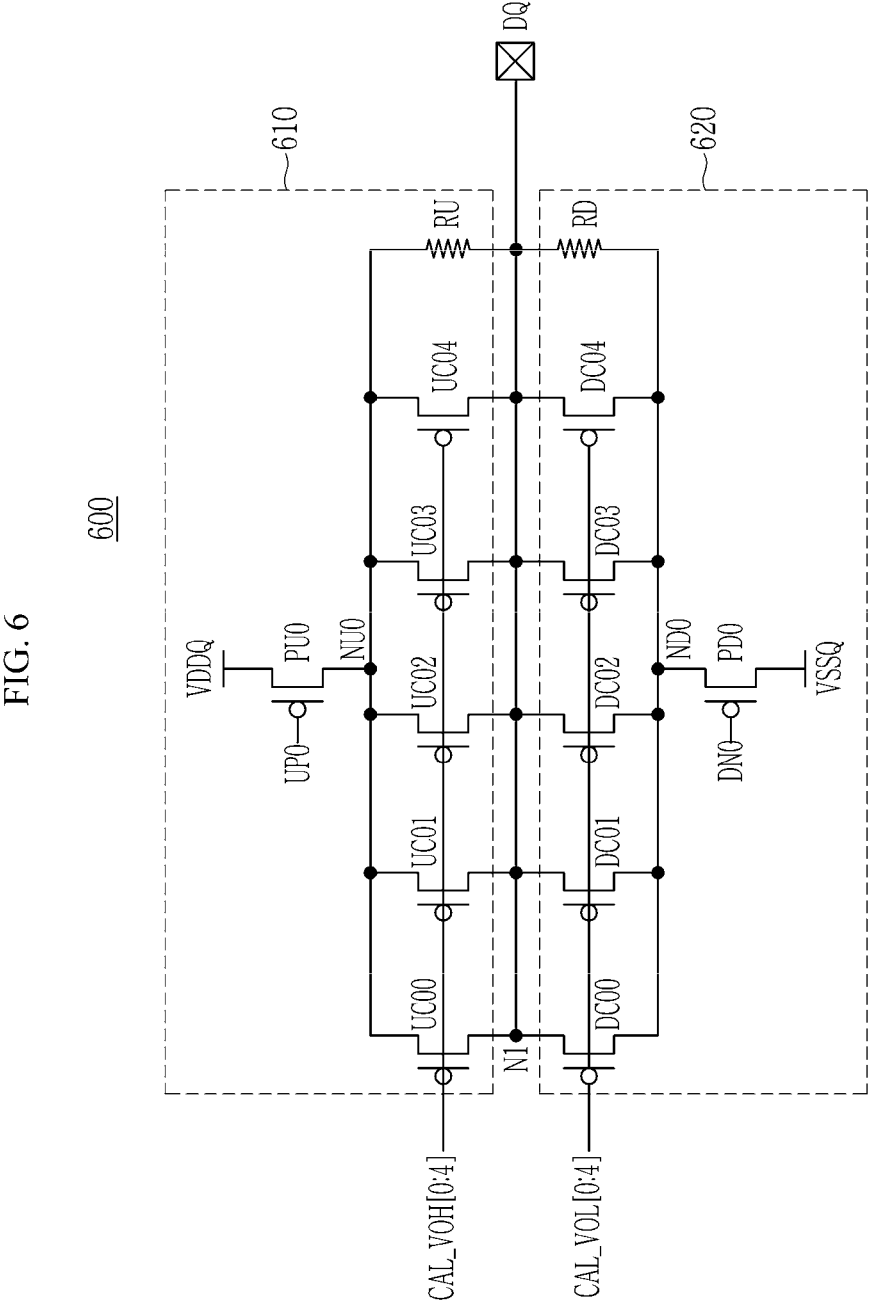
FIG. 6 shows a circuit diagram of a pull-up unit and a pull-down unit of FIG. 5.
Figure 7:
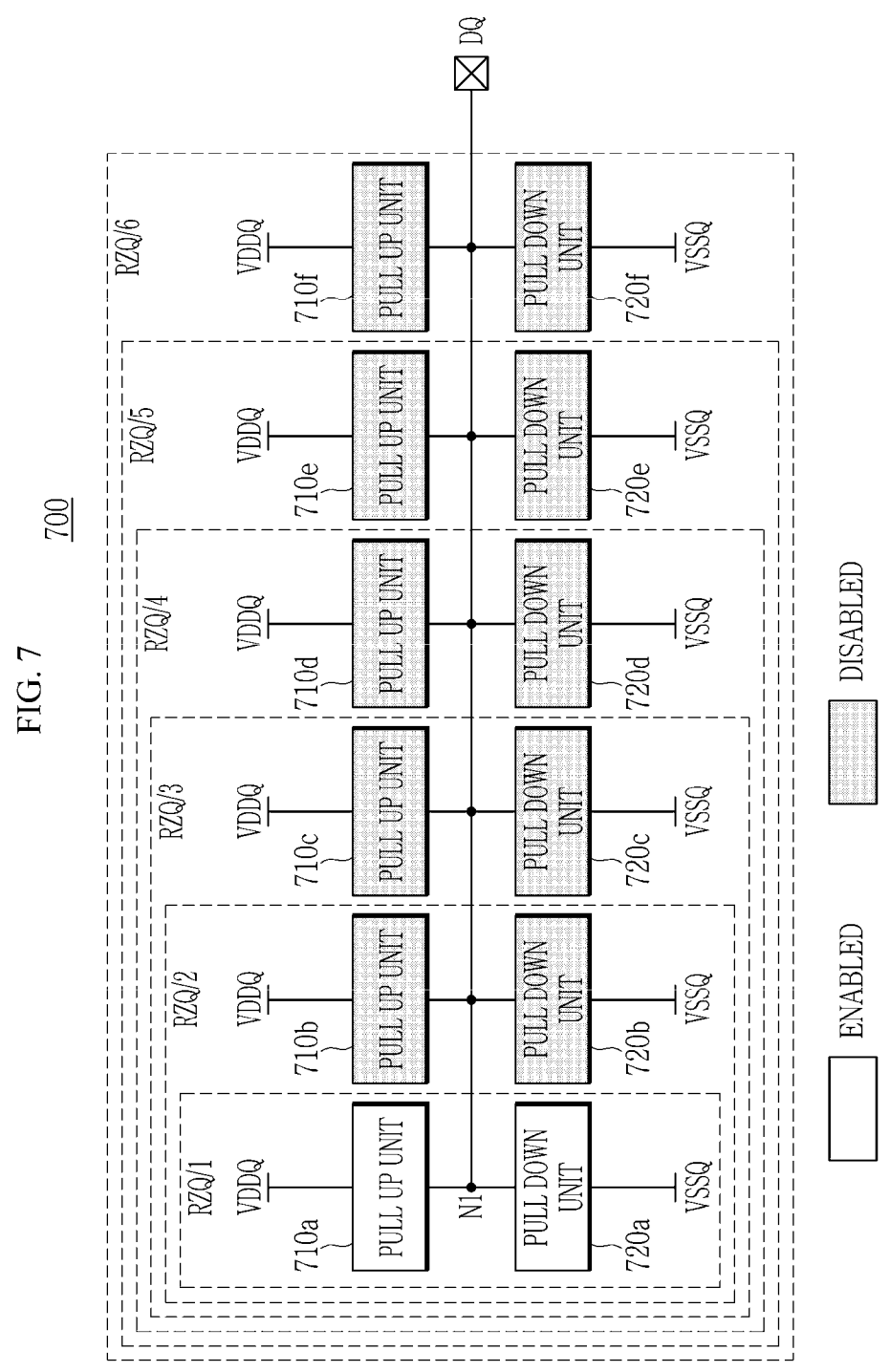
FIG. 7 shows an order of enabling pull-up units and pull-down units of FIG. 5 according to pull-down intensity.

FIG. 5 shows a block diagram of an output driver of a memory device according to an embodiment, FIG. 6 shows a circuit diagram of a pull-up unit and a pull-down unit of FIG. 5, and FIG. 7 shows an order of enabling pull-up units and pull-down units of FIG. 5 according to pull-down intensity.

Referring to FIG. 5, the output driver 500 may include pull-up units 510a, . . . , 510f and pull-down units 520a, . . . , 520f. The pull-up units 510a, . . . , 510f may be coupled in parallel to each other between a first power source voltage VDDQ and a first node N1. The pull-down units 520a, . . . , 520f may be coupled in parallel to each other between a second power source voltage VSSQ and the first node N1. The first node N1 may be connected to the DQ pad 530.

Referring to FIG. 6, the output driver 600 may include a pull-up unit 610 and a pull-down unit 620. The pull-up unit 610 may include a plurality of calibration transistors UC00, . . . , UC04, a pull-up transistor PU0, and a pull-up resistor RU. The pull-down unit 620 may include a plurality of calibration transistors DC00, . . . , DC04, a pull-down transistor PD0, and a pull-down resistor RD.

The calibration transistors UC00, . . . , UC04 may be coupled in parallel to each other between the first node N1 and the second node NUO. Calibration codes CAL_VOH [0:4] may be provided to gates of calibration transistors UC00, . . . , UC04. The pull-up transistor PU0 may be connected between the second node NUO and the first power source voltage VDDQ.

The calibration transistors DC00, . . . , DC04 may be coupled in parallel to each other between the first node N1 and the third node NDO. The calibration codes CAL_VOL [0:4] may be provided to the gates of the calibration transistors DC00, . . . , DC04. The pull-down transistor PD0 may be connected between the third node NDO and the second power source voltage VSSQ.

The pull-up resistor RU and the pull-down resistor RD may be designed with the same resistance as the ZQ resistor RZQ. The pull-up resistor RU and the pull-down resistor RD may be different from the ZQ resistor RZQ by temperatures, skew conditions, and processing variables. In S410, the memory device 200 may perform a ZQ calibration and may generate calibration codes CAL_VOH[0:4] and CAL_VOL

[0:4] so that the pull-up resistor RU and the pull-down resistor RD may be substantially equivalent to the ZQ resistor RZQ.

In S400, the memory controller 300 may set the termination resistance of the memory device 200 to be 1/n times the ZQ resistance (n is a natural number) according to the operation speed of the memory device 200. The memory controller 300 may set the termination resistance of the memory device 200 less (e.g., to a lower resistance value) the more the operation speed of the memory device 200 increases. For example, when the memory device 200 is initially driven, the memory controller 300 may transmit the MRS command and the OP code to the memory device 200 to set the termination resistance of the memory device 200 to be equal to the resistance of the ZQ resistor. As the operation speed of the memory device 200 increases, the memory controller 300 may transmit the MRS command and the OP code to the memory device 200 to reduce the termination resistance of the memory device 200 to ½, ⅓, . . . , ⅙ of the resistance of the ZQ resistor.

Referring to FIG. 7, when the termination resistance of the memory device 200 is set to be RZQ/1, one pull-up unit 710a and one pull-down unit 720a are enabled, and other pull-up units 710b, . . . , 710f and pull-down units 720b, . . . , 720f are disabled. When the termination resistance of the memory device 200 is set to be RZQ/2, two pull-up units 710a and 710b and two pull-down units 720a and 720b are enabled, and other pull-up units 710c, . . . , 710f and pull-down units 720c, . . . , 720f are disabled. As the termination resistance is set to be ½, ⅓, . . . , ⅙ of the resistance of the ZQ resistor, the pull-up units 710a, . . . , 710f and the pull-down units 720a, . . . , 720f of the output driver 700 may be sequentially enabled.

For example, when the pull-up unit 610 of the output driver 600 of FIG. 6 is enabled, the pull-up driving signal UP0 is applied to the gate of the pull-up transistor PU0, and the calibration codes CAL_VOH[0:4] are applied to the calibration transistors UC00, . . . , UC04, and the first node N1 and the first power source voltage VDDQ may be connected to each other. When the pull-up unit 610 of the output driver 600 is disabled, the pull-up driving signal UP0 is not applied to the gate of the pull-up transistor PU0. When the pull-down unit 620 of the output driver 600 is enabled, the pull-down driving signal DN0 is applied to the gate of the pull-down transistor PD0, and the calibration codes CAL_VOL[0:4] are applied to the gates of the calibration transistors DC00, . . . , DC04 so the first node N1 and the second power source voltage VSSQ may be connected to each other. When the pull-down unit 620 of the output driver 600 is disabled, the pull-down driving signal DN0 is not applied to the gate of the pull-down transistor PD0.

Referring to FIG. 4, the memory controller 300 writes and reads test data to/from the FIFO portion of the memory device 200 (S420). For example, the memory controller 300 may transmit a write command and test data to the memory device 200, and may transmit a read command to the memory device 200.

The memory controller 300 detects whether the data signal DQ from the memory device 200 has or indicates defects (S430). The memory controller 300 may detect whether the data signal DQ has or indicates defects based on the waveform of the data signal DQ. In some embodiments, the memory controller 300 may determine that the data signal DQ has or indicates defects when the data signal DQ is less than the reference voltage. In some embodiments, the memory controller 300 may compare voltage sizes of the data signals DQ that are output corresponding to the same logic value, and may determine whether a plurality of output drivers 500 for outputting a plurality of data signals DQ have defects. For example, the memory controller 300 may compare the voltage sizes of the data signals DQ output to a plurality of DQ pads 530 corresponding to the same logic value "1" and may determine the data signal that has the least voltage to be defective. A stage S430 will now be described with reference to FIG. 8 and FIG. 9.

Figure 8:
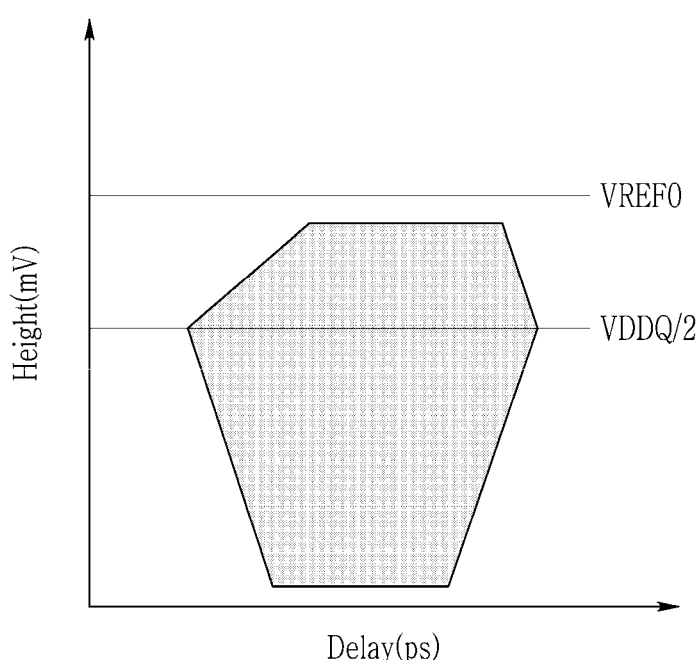
FIG. 8 and FIG. 9 show an eye diagram of output signals of an output driver of a memory device according to an embodiment.
Figure 9:
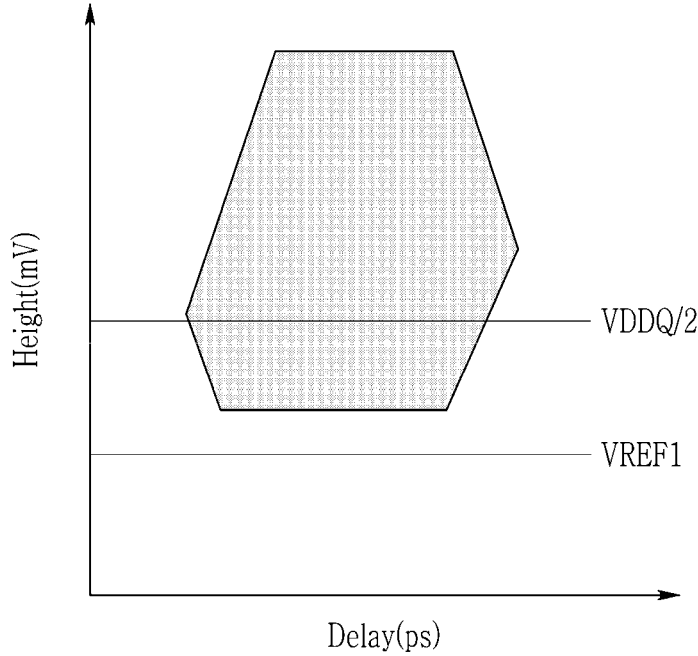

FIG. 8 and FIG. 9 show an eye diagram of data signals output by an output driver of a memory device according to an embodiment.

FIG. 8 shows a data signal DQ when a pull-up resistor of the output driver 700 is faulty. The data signal DQ output from the memory device 200 corresponding to the logic value "1" may have a lower voltage than a reference voltage VREF0 that is used by the memory controller 300 to determine or recognize the data signal DQ to be the logic value "1".

FIG. 9 shows a data signal DQ when a pull-down resistor of an output driver 700 is faulty. The data signal DQ output from the memory device 200 corresponding to the logic value "0" may have a higher voltage than a reference voltage VREF1 that is used by the memory controller 300 to determine or recognize the data signal DQ to be the logic value "0".

The memory controller 300 may determine whether the pull-up resistor and/or the pull-down resistor of the output driver 500 have defects based on the waveform of the data signal DQ.

The memory controller 300 disables the pull-up resistor and/or the pull-down resistor to which the defect is generated, and enables the repair resistor (S440). When a defect is generated due to the pull-up resistor, the memory controller 300 may detect the pull-up resistor to which the defect is generated or attributed from among a plurality of pull-up resistors. When a defect is generated due to the pull-down resistor, the memory controller 300 may detect the pull-down resistor to which the defect is generated or attributed from among a plurality of pull-down resistors. In some embodiments, the memory controller 300 may disable the pull-up resistor to which the defect is generated or attributed included in the at least one pull-up unit that was enabled in S400, and may enable the repair resistor included in at least one pull-up unit that was disabled in S400. This will now be described with reference to FIG. 10.

Figure 10:
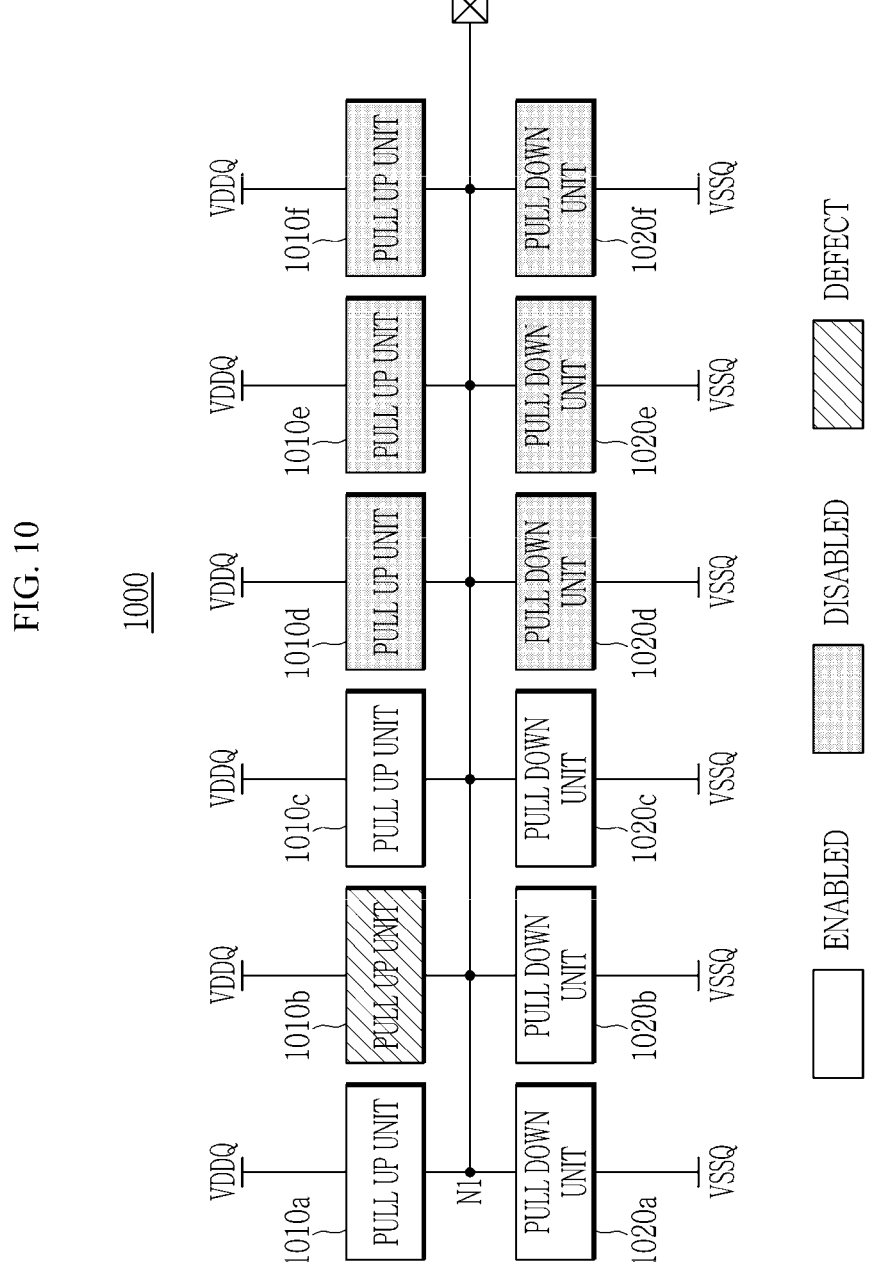
FIG. 10 shows a block diagram of an output driver having resistor defects.

FIG. 10 shows a block diagram of an output driver having resistor defects.

Referring to FIG. 10, in S400, the termination resistance of the memory device 200 may be set to be ⅓ of the resistance of the ZQ resistor, and the three pull-up units 1010a, . . . , 1010c and the three pull-down units 1020a, . . . , 1020c of the output driver 1000 may be enabled such that their collective resistance provides the desired termination resistance. That is, the three pull-up units 1010a, . . . , 1010c are enabled, and the three pull-up resistors are coupled in parallel between the first power source voltage VDDQ and the first node N1 so the termination resistance may be set to be ⅓ of the resistance of the ZQ resistor. In a like way, the three pull-down units 1020a, . . . , 1020c are enabled, and the three pull-down resistors are coupled in parallel between the second power source voltage VSSQ and the first node N1 so the termination resistance may be set to be ⅓ of the resistance of the ZQ resistor.

A defect may be generated due to the pull-up resistor of the pull-up unit 1010b from among the three enabled pull-up units 1010a, . . . , 1010c. Because of the defect of the pull-up resistor of the pull-up unit 1010*b*, the data signal DQ output by the output driver 1000 corresponding to the logic value "1" may have a lower voltage than the reference voltage VREF0 that is used by the memory controller 300 to determine or recognize the data signal DQ to be the logic value "1".

The memory controller 300 may determine that a pull-up resistor defect is generated or attributable to the output driver 1000, and may sequentially disable the pull-up resistors included in a subset of the pull-up units, for example, the three enabled pull-up units 1010*a*, . . . , 1010*c*. In some embodiments, the memory controller 300 may provide the MRS command and the OP code to the memory device 200, and may disable the pull-up resistors included in the three enabled pull-up units 1010*a*, . . . , 1010*c*. When the OP code is written to the mode register 222 of FIG. 2 by the MRS command, the pull-up resistor may be disabled by the OP code. The memory device 200 may, when the pull-up resistors included in the three enabled pull-up units 1010*a*, . . . , 1010*c* are disabled, enable the disabled pull-up units 1010*d*, . . . , 1010*f*. When the termination resistance is set to be ZQ/3, the three pull-up units may be enabled. Since the pull-up resistor included in one pull-up unit 1010*b* from among the three pull-up units 1010*a*, . . . , 1010*c* is disabled, the memory device 200 may enable one of the pull-up units 1010*d*, . . . , 1010*f* and may enable three pull-up units 1010*a*, 1010*c*, and 1010*d*. In this instance, the memory device 200 may enable a subset including the same number of the pull-up units as the number of the pull-up resistors disabled by the OP code. That is, when the two pull-up resistors included in the pull-up units 1010*a*, . . . , 1010*c* are disabled by the MRS command, the memory device 200 may enable two of the pull-up units 1010*d*, . . . , 1010*f*.

In some embodiments, when the termination resistance of the memory device 200 is set to be a small value and a defect is generated to or indicated by the data signal DQ, the memory controller 300 may disable the pull-up units and/or the pull-down units that are additionally enabled as the termination resistance is changed. For example, when the data signal DQ when the termination resistance of the memory device 200*u* is set to be ZQ/1 is normal and the data signal DQ when the termination resistance is set to be ZQ/3 is faulty, the memory controller 300 may disable the pull-up units 1010*b* and 1010*c* that are enabled as the termination resistance is set to be ZQ/3.

The memory controller 300 may provide an OP code for disabling the pull-up resistor to the memory device 200, and may receive the data signal DQ from the memory device 200. The memory controller 300 may determine whether the data signal DQ has or indicates a defect. The memory controller 300 may, when the data signal DQ has or indicates a defect, provide an OP code for disabling the pull-up resistor that is not the pull-up resistor (or is not among the pull-up resistors) disabled by the OP code to the memory device 200, and may receive the data signal DQ from the memory device 200. The memory controller 300 may, when the newly received data signal DQ has or indicates no defects, determine the pull-up resistor disabled by the OP code to be a defective resistor. The memory controller 300 ends the stage of S440. Accordingly, the memory controller 300 may disable the defective pull-up resistor. Additionally, the memory controller 300 may store information on the defective pull-up resistor corresponding to the memory device 200. The OP code and the mode register will now be described with reference to FIG. 11 and FIG. 12.

FIG. 11 shows an OP code of a memory controller according to an embodiment, and FIG. 12 shows a mode register of a memory device according to an embodiment.

Referring to FIG. 11, the OP code 1100 may include a plurality of bits that correspond to a plurality of pull-up resistors (or pull-down resistors). Values of the respective bits may be "0" or "1". The "0" may enable the pull-up resistor (or the pull-down resistor) that corresponds to the corresponding bit, and the "1" may disable the pull-up resistor (or the pull-down resistor) that corresponds to the corresponding bit.

Referring to FIG. 12, the mode register 1200 may store the OP code that corresponds to a plurality of pull-up resistors. The OP[5:0] registers may store parameters for disabling/enabling the pull-up resistors included in the pull-up units. The OP[7:6] register may provide a reserved future usage (RFU) field. The memory controller 300 may provide the MR address together with the MRS command for requesting to store the OP code, and the OP code may be stored in a region indicated by the MR address based on the control by the command decoder 221.

Figure 13:
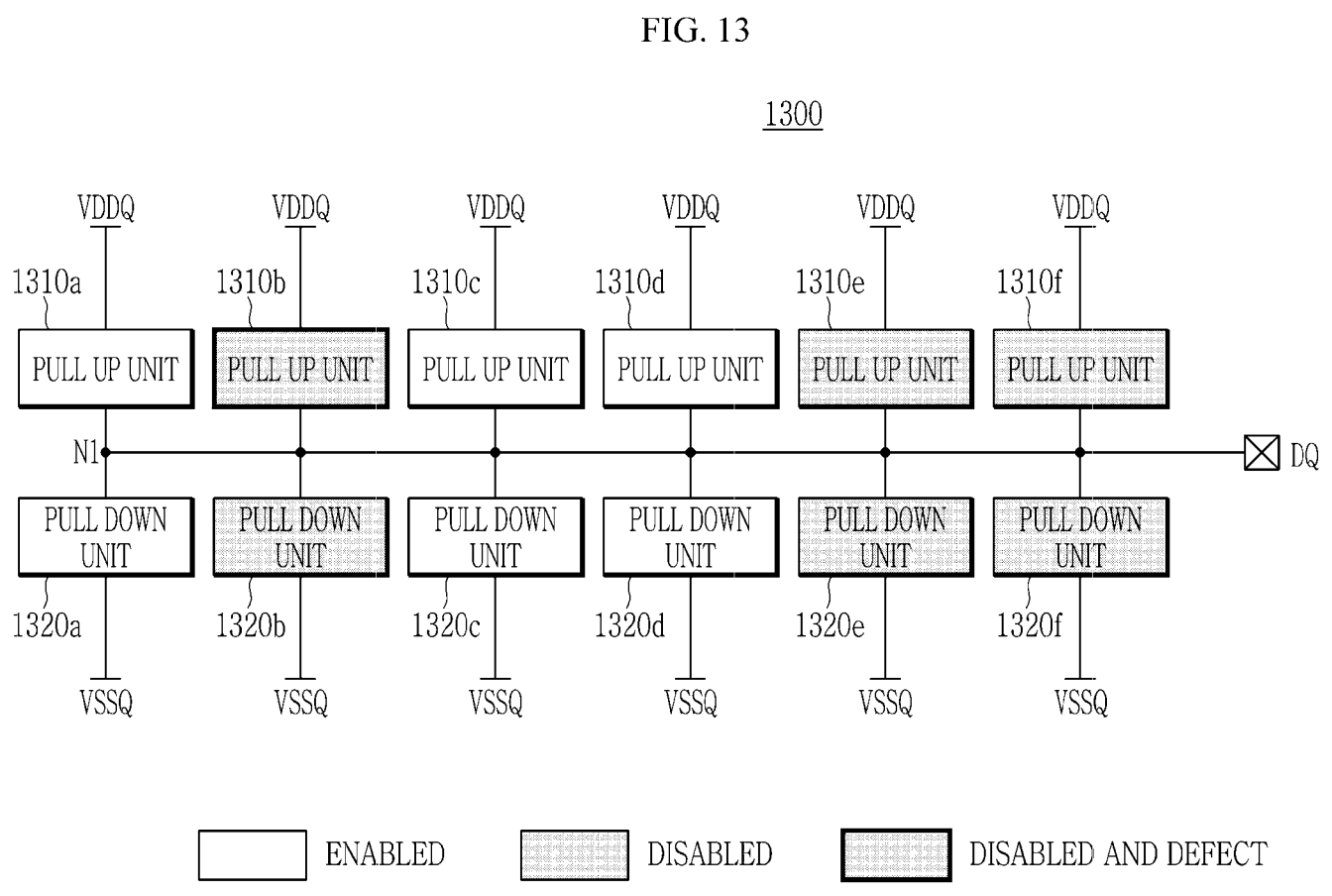

FIG. 13 shows an output driver with repaired resistor defects according to an embodiment.

Referring to FIG. 13, a defect is generated due to the pull-up resistor of the pull-up unit 1310*b* of the output driver 1300. The pull-up resistor of the pull-up unit 1310*b* and the pull-down resistor of the pull-down unit 1320*b* making a pair or paired with the pull-up unit 1310*b* are disabled by the OP code, and to satisfy the termination resistance of ZQ/3, the pull-up unit 1310*d* and the pull-down unit 1320*d* making a pair with the pull-up unit 1310*d* may be enabled.

The memory controller 300 may increase the operation speed of the memory device 200, and may change the termination resistance into ZQ/4. The memory device 200 may enable one of the pull-up resistors of the pull-up units 1310*e* and 1310*f* (excluding the pull-up resistor of the pull-up unit 1310*b* that was disabled by the OP code stored in the mode register 1200) and one of the pull-down resistors of the pull-down units 1320*e* and 1320*f* (excluding the pull-down resistor of the disabled pull-down unit 1320*b*).

It has been described in the above that the pull-up unit 1310*b* and the pull-down unit 1320*b* making a pair or paired with the pull-up unit 1310*b* to which the pull-up resistor defect is generated or attributed are disabled together by the OP code. However, in some embodiments, when the pull-up unit 1310*b* is disabled, the pull-down unit 1320*b* may not be disabled, and the pull-up unit 1310*d* and the pull-down unit 1320*b* may be enabled. In some embodiments, the memory device 200 may include a mode register for storing a first OP code for disabling/enabling the pull-up resistor and a mode register for storing a second OP code for disabling/enabling the pull-down resistor. The output driver 1300 may disable the pull-up resistor to which a defect is generated or attributed based on the first OP code, and may disable the pull-down resistor to which a defect is generated or attributed based on the second OP code.

According to an embodiment, the output driver 1300 having the pull-up resistor and/or the pull-down resistor to which a defect is generated or attributed may be easily repaired. Therefore, when a defect is generated due to the output driver connected to one data signal DQ output pin in the high-bandwidth I/O memory device 200 having a plurality of data signal DQ output pins, this may be easily repaired.

Figure 14:
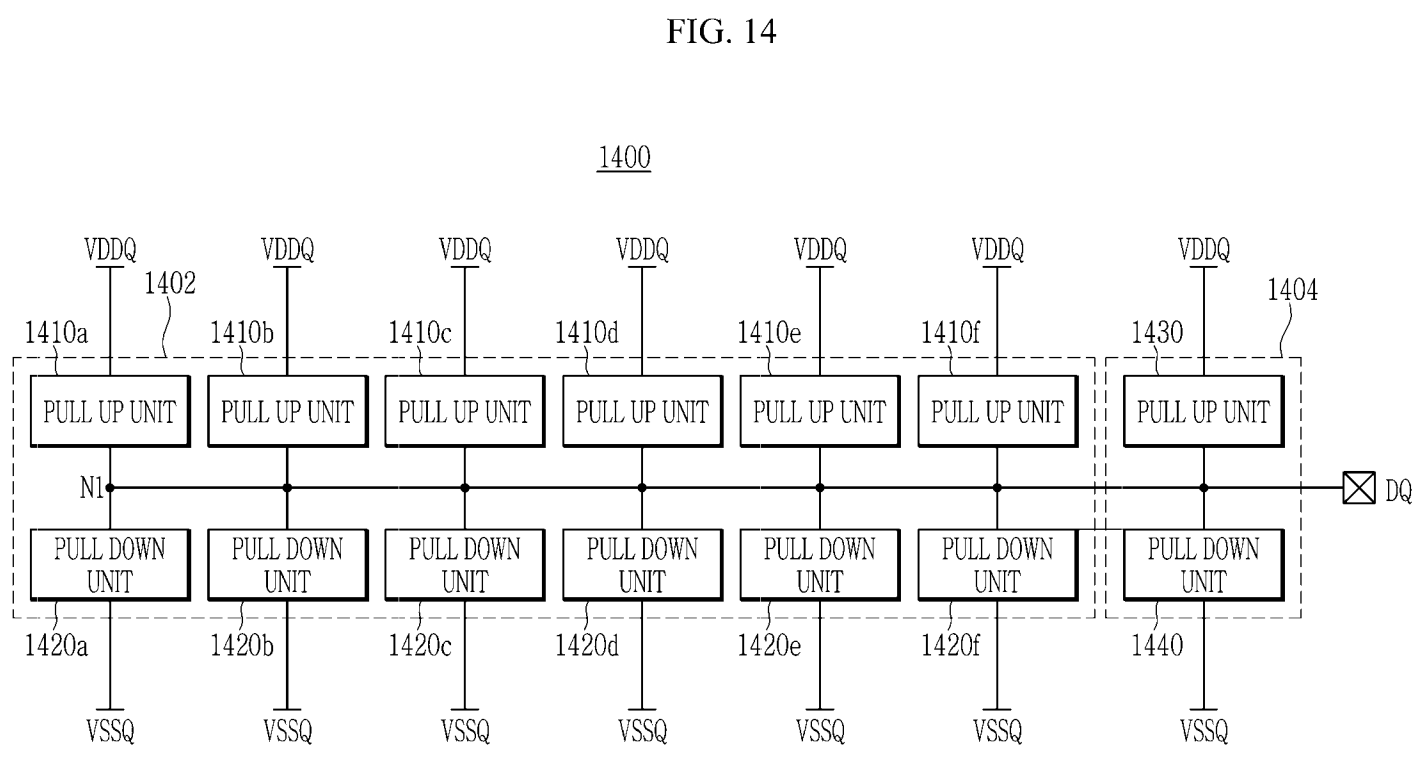

FIG. 14 shows a block diagram of an output driver of a memory device according to an embodiment.

Referring to FIG. 14, the output driver 1400 may include a first output unit 1402 and a second output unit 1404. The first output unit 1402 may be operated in a normal state in which no defect is generated due to the pull-up resistor and/or the pull-down resistor, and the second output unit 1404 may be operated with the first output unit 1402 in a defective state in which a defect is generated due to at least one pull-up resistor and/or pull-down resistor of the first output unit 1402.

The first output unit 1402 may include a plurality of pull-up units 1410$a$, . . . , 1410$f$ and a plurality of pull-down units 1420$a$, . . . , 1420$f$. The second output unit 1404 may include at least one repair pull-up unit 1430 and at least one repair pull-down unit 1440. In some embodiments, the number of repair pull-up units 1430 may be equal to or less than the number pull-up units 1410$a$, . . . , 1410$f$, and the number of repair pull-down units 1440 may be equal to or less than the number of pull-down units 1420$a$, . . . , 1420$f$.

When a pull-up resistor defect and/or a pull-down resistor defect is generated or attributable to the first output unit 1402, the memory controller 300 may perform the stage of S440 to disable the pull-up resistor and/or the pull-down resistor to which a defect is generated. The memory device 200 may, when the pull-up resistor and/or the pull-down resistor included in the first output unit 1402 is disabled, enable the second output unit 1404, that is, by enabling one or more of the repair pull-up units 1430 or pull-down units 1440.

Figure 15:
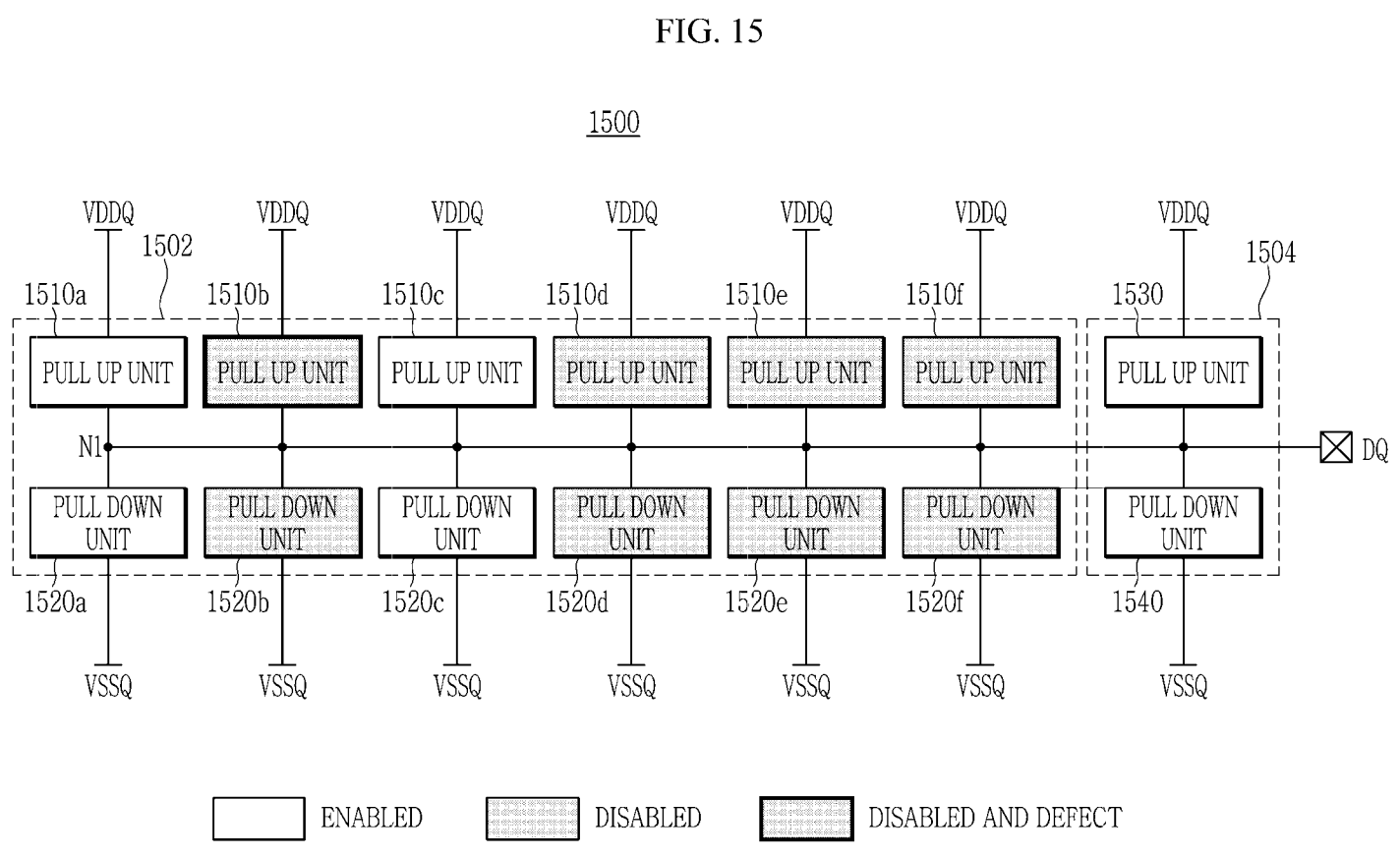

FIG. 15 shows an output driver with one resistor defect repaired according to an embodiment.

Referring to FIG. 15, a defect may be generated to the pull-up resistor of the pull-up unit 1510$b$ of the first output unit 1502 of the output driver 1500, the pull-up resistor of the pull-up unit 1510$b$ may be disabled by the OP code, and to satisfy the termination resistance of ZQ/3, the repair pull-up unit 1530 of the second output unit 1504 may be enabled. In some embodiments, as shown in FIG. 15, the pull-down unit 1520$b$ paired with the defective pull-up unit 1510$b$ may also be disabled by the OP code, and the repair pull-down unit 1540 paired with the enabled repair pull-up unit 1530 may also be enabled.

According to an embodiment, the output driver 1500 having the pull-up resistor and/or the pull-down resistor to which a defect is generated may be easily repaired. Therefore, when a defect is generated or attributable to the output driver connected to one data signal DQ output pin in the high-bandwidth I/O memory device 200 having a plurality of data signal DQ output pins, this may be easily repaired.

Figure 16:
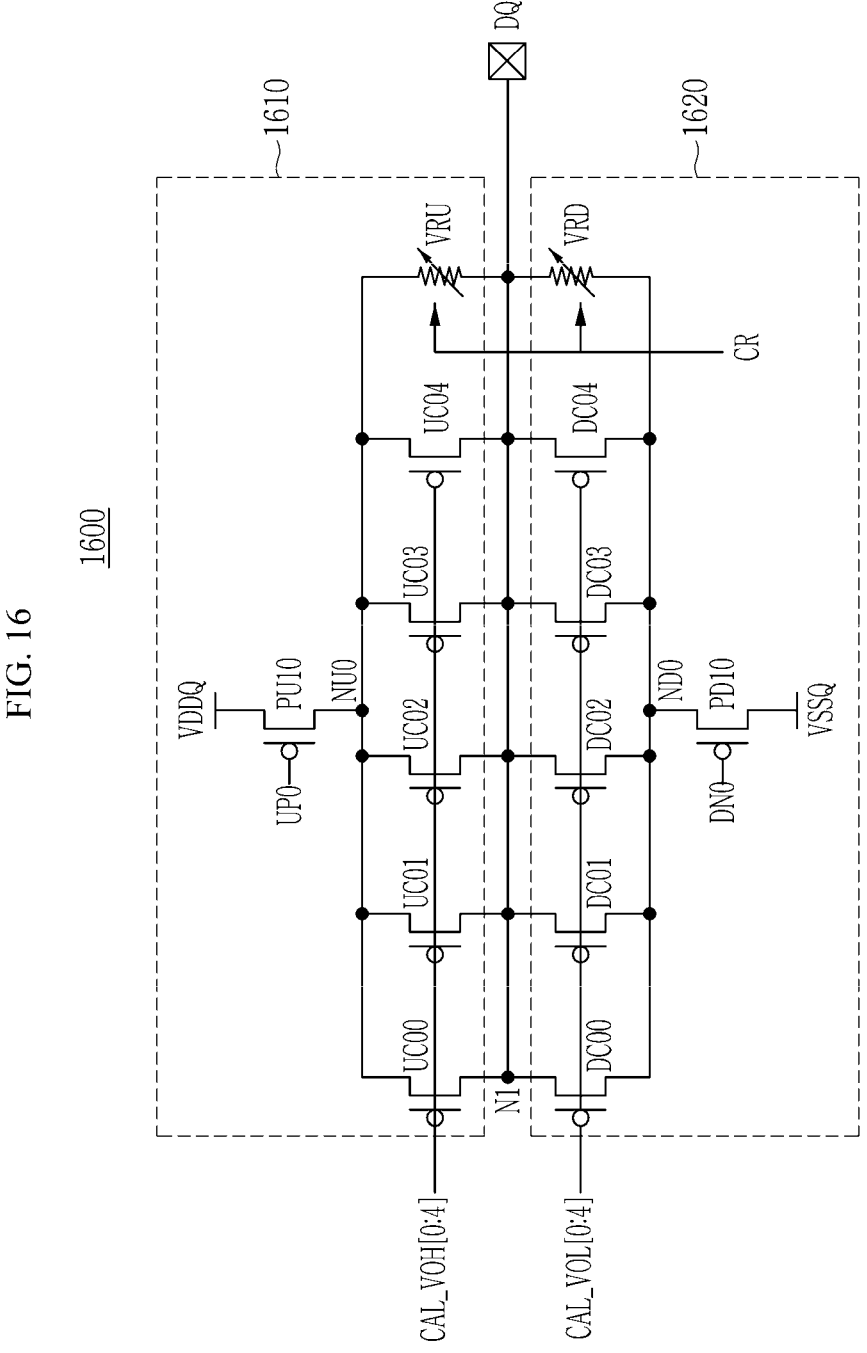
FIG. 16 shows a circuit diagram of a pull-up unit having a variable resistor according to an embodiment.

FIG. 16 shows a circuit diagram of a second output unit including a repair pull-up unit and a repair pull-down unit having a variable resistor according to an embodiment.

Referring to FIG. 16, the second output unit 1600 may include a repair pull-up unit 1610 and a repair pull-down unit 1620. The repair pull-up unit 1610 may include a plurality of calibration transistors UC00, . . . , UC04, a pull-up transistor PU10, and a pull-up resistor VRU. The repair pull-down unit 1620 may include a plurality of calibration transistors DC00, . . . , DC04, a pull-down transistor PD10, and a pull-down resistor VRD.

The pull-up resistor VRU and the pull-down resistor VRD may be variable resistors. Resistance of the pull-up resistor VRU and the pull-down resistor VRD may be adjusted by a control signal CR. The control signal CR may adjust resistance of the pull-up resistor VRU and the pull-down resistor VRD corresponding to the resistance value of the disabled pull-up resistor and/or the disabled pull-down resistor. The control signal CR may be generated based on the control by the command decoder 221.

According to an embodiment, the output driver having the pull-up resistor and/or the pull-down resistor to which a defect is generated may be easily repaired. Therefore, when a defect is generated or attributable to the output driver connected to the data signal DQ output pins in the high-bandwidth I/O memory device 200 having a plurality of data signal DQ output pins, this may be easily repaired.

Figure 17:
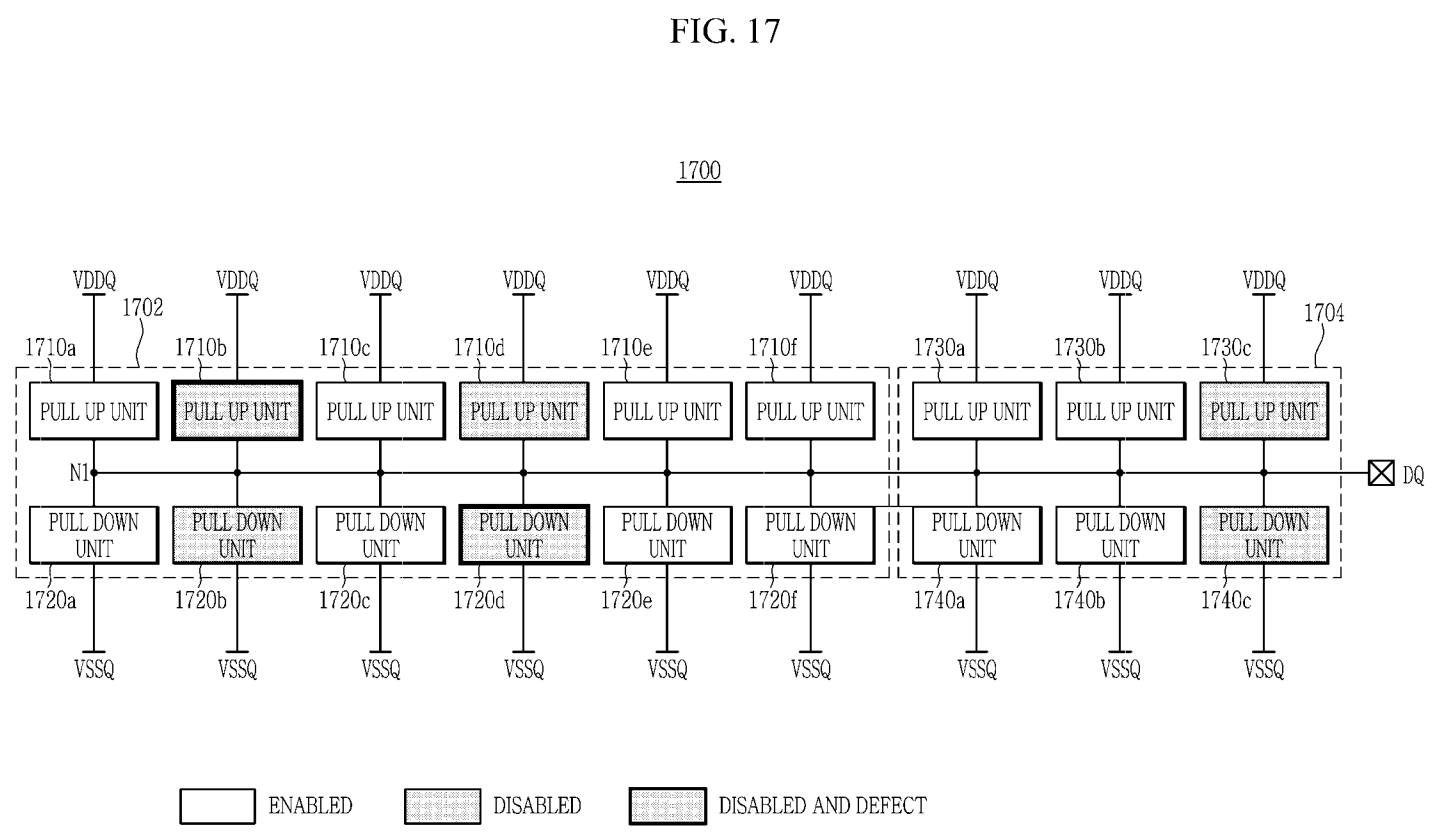

FIG. 17 shows an output driver with repaired resistor defects according to an embodiment.

Referring to FIG. 17, a defect is generated due to the pull-up resistor of the pull-up unit 1710$b$ of the first output unit 1702 of the output driver 1700, a defect is generated due to the pull-down resistor of the pull-down unit 1720$d$. In response to detecting the presence of the defect, the pull-up resistor of the pull-up unit 1710$b$ and the pull-down resistor of the pull-down unit 1720$d$ may be disabled by the OP code, and to satisfy the termination resistance of ZQ/6, the repair pull-up units 1730$a$ and 1730$b$ and the repair pull-down units 1740$a$ and 1740$b$ of the second output unit 1704 may be enabled.

According to an embodiment, the output driver 1700 having the pull-up resistor and/or the pull-down resistor to which a defect is generated may be easily repaired. Therefore, when a defect is generated or attributable to the output driver connected to the data signal DQ output pins in the high-bandwidth I/O memory device 200 having a plurality of data signal DQ output pins, this may be easily repaired.

Figure 18:
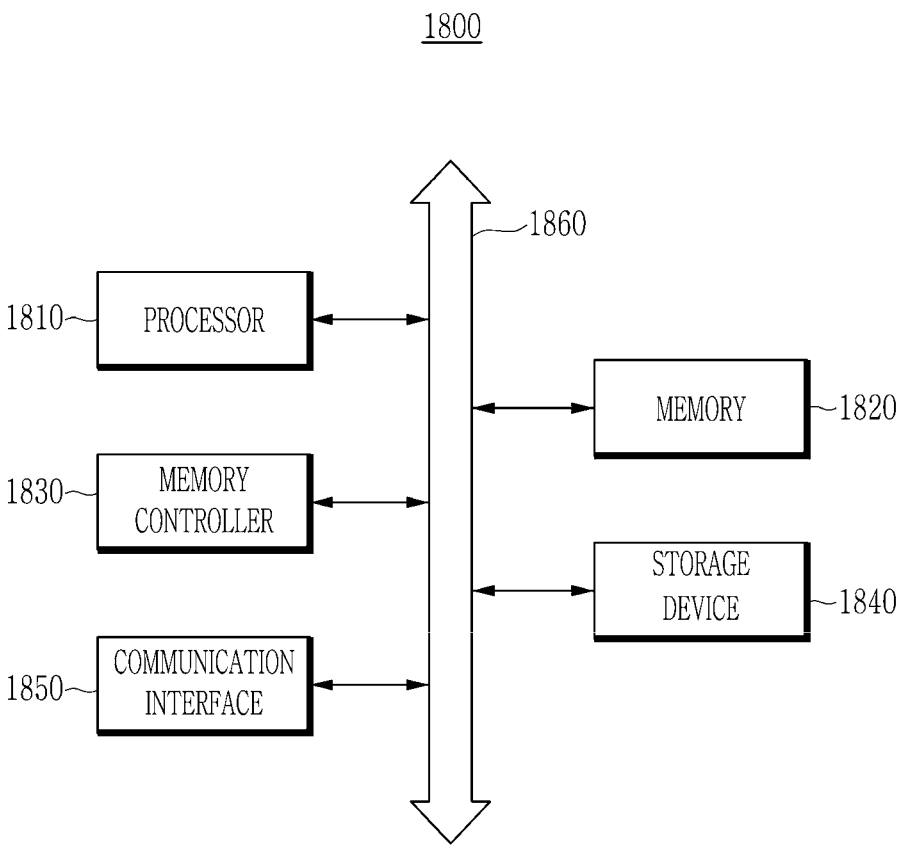
FIG. 18 shows a block diagram of a computer system according to an embodiment.

FIG. 18 shows a block diagram of a computer system according to an embodiment.

Referring to FIG. 18, the memory system 1800 includes a processor 1810, a memory 1820, a memory controller 1830, a storage device 1840, a communication interface 1850, and a bus 1860. The memory system 1800 may further include other general-purpose constituent elements.

The processor 1810 controls general operations of respective elements of the memory system 1800. The processor 1810 may be realized with at least one of various processing units including a central processing unit (CPU), an application processor (AP), and a graphics processing unit (GPU).

The memory 1820 stores various types of data and commands. The memory 1820 may be realized with the memory device described with reference to FIG. 1 to FIG. 17. The memory controller 1830 controls transmission of data or commands to/from the memory 1820.

The processor 1810 and the memory controller 1830 may be realized with the memory controller described with reference to FIG. 1 to FIG. 17. In some embodiments, the memory controller 1830 may be provided as an internal element of the processor 1810. In some embodiments, the memory controller 1830 may be provided as a chip in addition to the processor 1810.

The memory controller 1830 may disable resistance of the output driver of the memory 1820 based on the output signal from the memory 1820. The memory controller 1830 may, when a margin fail of the output signal is generated, provide an OP code for disabling/enabling the pull-up resistor and/or the pull-down resistor included in the output driver to the memory 1820 according to margin fail types.

The storage device 1840 non-temporarily stores program and data. In some embodiments, the storage device 1840 may be realized with a non-volatile memory. The communication interface 1850 supports wired/wireless network communication of the memory system 1800. Further, the communication interface 1850 may support various other communication methods in addition to the network communication. The bus 1860 provides a communication function among the constituent elements of the memory system 1800. The bus 1860 may include at least one type of bus according to communication protocols among the constituent elements.

In some embodiments, the respective constituent elements or combination of two or more of the constituent elements described with reference to FIG. 1 to FIG. 18 may be realized with a digital circuit, a programmable or non-programmable logic device or array, and an application specific integrated circuit (ASIC).

While this invention has been described in connection with what is presently considered to be practical embodiments, it is to be understood that the invention is not limited to the disclosed embodiments, but, on the contrary, is intended to cover various modifications and equivalent arrangements included within the scope of the appended claims.

What is claimed is:

1. A memory device comprising:
a mode register configured to store a first code for indicating termination resistance of the memory device and a second code for disabling a defective resistor; and
an output driver comprising a plurality of pull-up units including a plurality of pull-up resistors and a plurality of pull-down units including a plurality of pull-down resistors, wherein respective pull-up resistors and respective pull-down resistors are configured to be disabled or enabled based on the second code,
wherein the output driver is configured to enable, based on the first code, a subset of pull-up units from among the plurality of pull-up units including the respective enabled pull-up resistors based on the second code, and is configured to enable, based on the first code, a subset of pull-down units from among the plurality of pull-down units including the respective enabled pull-down resistors based on the second code.

2. The memory device of claim 1, wherein
a collective pull-up resistance of the respective pull-up resistors of the subset of pull-up units and/or a collective pull-down resistance of the respective pull-down resistors of the subset of pull-down units is substantially equivalent to the termination resistance.

3. The memory device of claim 1, wherein
the output driver further comprises at least one repair pull-up unit including at least one repair pull-up resistor and at least one repair pull-down unit including at least one repair pull-down resistor, and is configured to enable the subset of pull-up units from among the plurality of pull-up units including the respective pull-up resistors and the at least one repair pull-up unit based on the first code, and is configured to enable the subset of pull-down units from among the plurality of pull-down units including the respective pull-down resistors and the at least one repair pull-down unit based on the first code.

4. The memory device of claim 3, wherein
a number of the at least one repair pull-up unit is equal to or less than a number of pull-up units included in the subset of pull-up units, and a number of the at least one repair pull-down unit is equal to or less than a number of pull-down units included in the subset of pull-down units.

5. The memory device of claim 3, wherein
the at least one repair pull-up resistor and the at least one repair pull-down resistor comprise variable resistors, and
respective resistances of the variable resistors are configured to be adjusted based on the first code.

6. The memory device of claim 1, wherein
the second code includes a plurality of bits corresponding to the respective pull-up resistors, and a value of a bit that corresponds to the defective resistor from among the plurality of bits is different from values of other bits among the plurality of bits, and
the output driver is configured to disable one of the respective pull-up resistors that corresponds to the defective resistor and one of the respective pull-down resistors that is paired with the one of the respective pull-up resistors.

7. The memory device of claim 1, wherein
the second code includes a third code including a plurality of bits that correspond to the respective pull-up resistors and a fourth code including a plurality of bits that correspond to the respective pull-down resistors, and a value of a bit that corresponds to the defective resistor from among the plurality of bits is different from values of other bits among the plurality of bits, and
the output driver is configured to disable one of the respective pull-up resistors that corresponds to the defective resistor based on the third code, and is configured to disable one of the respective pull-down resistors that corresponds to the defective resistor based on the fourth code.

8. The memory device of claim 1, wherein
the plurality of pull-up units are coupled in parallel to each other, and the plurality of pull-down units are coupled in parallel to each other, and
the output driver is configured to increase a number of pull-up units included in the subset of pull-up units and a number of pull-down units included in the subset of pull-down units as resistance of the termination resistance indicated by the first code is reduced.

9. A memory system comprising:
a memory device comprising a data input and output circuit including a plurality of pull-up units and a plurality of pull-down units and configured to output data signals through a data input and output pad, and a mode register configured to store a first code for indicating termination resistance of the memory device and a second code for disabling at least one of a plurality of resistors included in the data input and output circuit; and
a memory controller configured to receive a data signal among the data signals, determine whether the data signal indicates a defect, generate the second code responsive to determining that the data signal indicates the defect, provide the second code to the memory device, and generate and provide the first code to the memory device.

10. The memory system of claim 9, wherein
the memory controller is configured to determine whether the data signal indicates the defect based on whether a voltage level of the data signal is recognizable as a logic value "0" or "1".

11. The memory system of claim 9, wherein
when the data signal has a defect, the memory controller is configured to change a value of the second code and provide the second code indicating the value that was changed to the memory device.

12. The memory system of claim 9, wherein
the plurality of pull-up units include pull-up resistors, the
plurality of pull-down units include pull-down resis-
tors, and the plurality of resistors include the pull-up
resistors and the pull-down resistors.

13. The memory system of claim 12, wherein
when the data signal is not recognizable as a logic value
"0", the memory controller is configured to determine
that defects are generated due to one or more of the
pull-down resistors, and is configured to generate the
second code, and
when the data signal is not recognizable as a logic value
"1", the memory controller is configured to determine
that defects are generated due to one or more of the
pull-up resistors, and is configured to generate the
second code.

14. The memory system of claim 12, wherein
the second code includes a plurality of bits that corre-
spond to the pull-up resistors, and a value of a bit
among the plurality of bits that corresponds to a defec-
tive resistor is different from values of other bits among
the plurality of bits, and
the memory device is configured to disable one of the
pull-up resistors that corresponds to the defective resis-
tor and one of the pull-down resistors that is paired with
the one of the pull-up resistors.

15. The memory system of claim 12, wherein
the memory controller is configured to generate a param-
eter for setting termination resistance of the memory
device, and
the memory device is configured to enable a subset of
pull-up units that corresponds to a value of the param-
eter from among the plurality of pull-up units and a
subset of pull-down units that corresponds to a value of
the parameter from among the plurality of pull-down
units, and is configured to output the data signal.

16. The memory system of claim 15, wherein
the plurality of pull-up units are coupled in parallel to
each other, the plurality of pull-down units are coupled
in parallel to each other, and the memory device is configured to increase a number of
pull-up units included in the subset of pull-up units and
a number of pull-down units included in the subset of
pull-down units as resistance value of the termination
resistance indicated by the parameter is reduced.

17. A method for operating a memory device, the method
comprising:
writing or reading test data to or from a first in, first out
(FIFO) portion of the memory device;
determining whether a data signal output by the memory
device indicates a defect; and
enabling one or more resistors based on a code indicating
the defect among a plurality of resistors included in the
memory device; and
enabling a subset of pull-up units from among a plurality
of pull-up units including the respective enabled one or
more resistors and a subset of pull-down units from
among a plurality of pull-down units including the
respective enabled one or more resistors based on
setting termination resistance of the memory device.

18. The method of claim 17, wherein the determining
whether the data signal indicates the defect comprises:
determining whether the data signal indicates the defect
based on whether a voltage level of the data signal is
recognized as a logic value "0" or "1".

19. The method of claim 17, wherein the enabling one or
more resistors comprises:
disabling one or more resistors corresponding to the
defect; and
enabling a number of one or more repair resistors based
on a number of the one or more resistors that were
disabled.

20. The method of claim 17, wherein the enabling one or
more resistors comprises:
disabling one or more resistors corresponding to the
defect; and
adjusting resistance of one or more repair resistors based on
resistance of the one or more resistors that were disabled.

\* \* \* \* \*